(12) United States Patent
Watanabe et al.

(10) Patent No.: US 8,920,569 B2
(45) Date of Patent: Dec. 30, 2014

(54) POLLUTANT REMOVAL METHOD AND APPARATUS, AND EXPOSURE METHOD AND APPARATUS

(75) Inventors: Shunji Watanabe, Setagaya-ku (JP);
Masato Hamatani, Kounosu (JP);
Tatsuya Kitamoto, Totsuka-ku (JP)

(73) Assignee: Nikon Corporation, Tokyo (JP)

( * ) Notice: Subject to any disclaimer, the term of this patent is extended or adjusted under 35 U.S.C. 154(b) by 1097 days.

(21) Appl. No.: 11/141,469

(22) Filed: Jun. 1, 2005

(65) Prior Publication Data
US 2005/0274898 A1    Dec. 15, 2005

Related U.S. Application Data

(63) Continuation of application No. PCT/JP03/14991, filed on Nov. 25, 2003.

(30) Foreign Application Priority Data

Dec. 3, 2002  (JP) ................................ 2002-350944
Apr. 18, 2003 (JP) ................................ 2003-115098

(51) Int. Cl.
*B08B 3/00*    (2006.01)
*B08B 7/04*    (2006.01)
*G03F 7/20*    (2006.01)
*G02B 27/00*   (2006.01)

(52) U.S. Cl.
CPC ........ *G03F 7/70941* (2013.01); *G02B 27/0006* (2013.01); *G03F 7/70916* (2013.01); *G03F 7/70925* (2013.01); *G03F 7/70975* (2013.01)
USPC ............. 134/6; 134/2; 134/3; 134/26; 134/28

(58) Field of Classification Search
CPC .............. B08B 3/00; B08B 3/04; B08B 3/08; B08B 1/006; B08B 7/04; G03F 7/70925; G03F 9/7096

USPC ......................................... 134/3, 26, 28, 6, 2
See application file for complete search history.

(56) References Cited

U.S. PATENT DOCUMENTS 2,024,277 A * 12/1935 Drescher ......................... 216/97
4,535,026 A *  8/1985 Yoldas et al. .............. 428/310.5

(Continued)

FOREIGN PATENT DOCUMENTS

| CN | 1221976 A | 7/1999 |
|---|---|---|
| CN | 1282588 A | 1/2001 |

(Continued)

OTHER PUBLICATIONS

Li Ping, "Deep Hot Acid Solution Blocking Agent Research and Application," Xian Petroleum Institute Report, vol. 15 Issue 4, pp. 49-51, Jul. 31, 2000.

(Continued)

*Primary Examiner* — Alexander Markoff
(74) *Attorney, Agent, or Firm* — Oliff PLC

(57) ABSTRACT

A method for quickly removing pollutants adhered to a predetermined optical member in an optical system. To remove the pollutants adhered to a lens (32A) disposed at the upper end of a projection optical system (PL), a cylindrical protecting member (53) is disposed through the openings in a reticle stage (22) and a reticle base (23). The bottom surface of a support section (56) at the tip section of a rod section (58) is brought into contact with the surface of the lens (32A) through the inner surface of the protecting member (53). A wiping cloth soaked with a washing solution containing hydrofluoric acid is attached to the bottom surface of the support section (56). The support section (56) is reciprocated via the rod section (58) to remove the pollutants on the lens (32A) with the wiping cloth.

31 Claims, 10 Drawing Sheets

(56) References Cited

U.S. PATENT DOCUMENTS

| | | | | |
|---|---|---|---|---|
| 4,841,645 A | * | 6/1989 | Bettcher et al. | 34/78 |
| 4,891,110 A | * | 1/1990 | Libman et al. | 204/478 |
| 5,181,142 A | * | 1/1993 | Asai et al. | 359/581 |
| 5,532,871 A | * | 7/1996 | Hashimoto et al. | 359/359 |
| 5,772,780 A | * | 6/1998 | Homma et al. | 134/7 |
| 5,837,662 A | | 11/1998 | Chai et al. | |
| 5,865,901 A | | 2/1999 | Yin et al. | |
| 5,972,123 A | * | 10/1999 | Verhaverbeke | 134/3 |
| 5,983,672 A | | 11/1999 | Jinbo et al. | |
| 6,262,796 B1 | | 7/2001 | Loopstra et al. | |
| 6,341,007 B1 | | 1/2002 | Nishi et al. | |
| 6,404,555 B1 | * | 6/2002 | Nishikawa | 359/619 |
| 6,496,257 B1 | | 12/2002 | Taniguchi et al. | |
| 6,568,995 B1 | | 5/2003 | Mitani et al. | |
| 2003/0020893 A1 | | 1/2003 | Kawashima | |
| 2005/0274898 A1 | | 12/2005 | Watanabe et al. | |

FOREIGN PATENT DOCUMENTS

| | | |
|---|---|---|
| EP | 1 220 038 A1 | 7/2002 |
| EP | 1 308 991 A1 | 5/2003 |
| JP | A 54-074291 | 6/1979 |
| JP | A 55-154348 | 12/1980 |
| JP | A 56-090876 | 7/1981 |
| JP | A-63-107842 | 5/1988 |
| JP | A-04-202027 | 7/1992 |
| JP | A 06-005324 | 1/1994 |
| JP | A 08-313705 | 11/1996 |
| JP | A-09-298148 | 11/1997 |
| JP | A-10-158035 | 6/1998 |
| JP | 11312658 A * | 11/1999 |
| JP | A-11-335140 | 12/1999 |
| JP | A 2000-323396 | 11/2000 |
| JP | A 2001-165769 | 6/2001 |
| JP | A 2001-206737 | 7/2001 |
| JP | A 2002-270501 | 9/2002 |
| JP | A 2002-296403 | 10/2002 |
| JP | A 2002-336804 | 11/2002 |
| JP | B2-4423559 | 12/2009 |
| WO | WO 98/24115 A1 | 6/1998 |
| WO | WO 98/40791 A1 | 9/1998 |
| WO | WO99/27568 | 6/1999 |
| WO | WO 99/49504 A1 | 9/1999 |
| WO | WO 02/09163 A1 | 1/2002 |

OTHER PUBLICATIONS

Supplementary European Search Report for European Application No. 03774200.4 dated Mar. 18, 2010.
English-language European Office Action issued Jan. 4, 2011 for European Patent Application No. 03 774 200.4.
Japanese International Search Report mailed Mar. 2, 2004 in International Application No. PCT/JP03/14991 with translation.
Japanese International Preliminary Examination Report mailed Jan. 26, 2005 in International Application No. PCT/JP2003/014991 with translation.
Chinese First Examination Report dated Jun. 6, 2008 in Chinese Application No. 200380104822.4 with translation.
Chinese Notification of the Second Office Action dated Aug. 28, 2009 in Chinese Application No. 200380104822.4 with translation.
Chinese Notification of the Third Office Action dated Dec. 25, 2009 in Chinese Application No. 200380104822.4 with translation.
Chinese Notification of the First Office Action dated Feb. 12, 2010 in Chinese Application No. 200810170975.3 with translation.
Chinese Notification of the First Office Action dated Mar. 10, 2010 in Chinese Application No. 200810170976.8 with translation.
Aug. 3, 2012 Office Action issued in Chinese Patent Application No. 200810170976.8 (with English Translation).
Office Action dated Dec. 7, 2011 issued in Chinese Patent Application No. 200810170976.8 (with translation).
Feb. 5, 2013 Office Action issued in Chinese Patent Application No. 200810170976.8 (with English translation).

* cited by examiner

POLLUTANT REMOVAL METHOD AND APPARATUS, AND EXPOSURE METHOD AND APPARATUS

CROSS-REFERENCE

This application is a Continuation Application of International Application No. PCT/JP03/014991 which was filed on Nov. 25, 2003 claiming the conventional priority of Japanese patent Application Nos. 2002-350944 filed on Dec. 3, 2002 and 2003-115098 filed on Apr. 18, 2003.

BACKGROUND OF THE INVENTION

1. Field of the Invention

The present invention relates to a pollutant removal technique for removing pollutants adhered to a surface of an optical member. In particular, the present invention is preferably usable to remove pollutants adhered to a surface of an optical member included in an illumination optical system or a projection optical system of a projection exposure apparatus which uses, for example, an excimer laser light source as an exposure light source.

2. Description of the Related Art

In relation to members classified into optical members which are not limited to optical members for the projection exposure apparatus, the presence of foreign matters adhered to the surface causes, for example, the uneven illuminance and the decrease in the transmittance of the light beam, and the optical performance, which is to be originally possessed by the optical element, is not obtained. Therefore, various countermeasures have been made thereagainst.

The following methods have been adopted to avoid the water droplet adhesion on the members such as spectacle lenses and front glasses of automobiles which dislike the cloudiness principally caused by water droplets. That is, a cloudiness-preventive agent containing a surfactant is applied to the uppermost layer (see, for example, Japanese Patent Application Laid-open No. 56-90876). The surface roughness is made coarse to increase the surface area so that the wettability is increased thereby to avoid the cloudiness (see, for example, Japanese Patent Application Laid-open No. 55-154348). The coating is formed with a substance including fluorine or with a hydrophobic polymer (see, for example, Japanese Laid-Open Patent Publication No. 54-74291).

On the other hand, the pulse laser beam such as the excimer laser is used in some situations as the exposure light beam in the projection exposure apparatus which is employed to transfer a pattern of a reticle as a mask onto respective shot areas of a wafer (or a glass plate or the like) applied with a resist as a photosensitive substrate (sensitive object) during the lithography step to produce devices including, for example, semiconductor elements and liquid crystal display elements. However, for example, if any organic substance is present in a minute amount in the gas on the optical path for the pulse laser beam, a thin film-shaped pollutant is adhered to the surface of the optical member on the optical path due to a kind of the photo-CVD (Chemical Vapor Deposition) action. As a result, it is feared that the transmittance may be gradually decreased, and/or the uneven illuminance may appear.

In view of the above, it has been investigated that the following method (1) or (2), which has been hitherto used, for example, in the technique for the camera, is adapted to the projection exposure apparatus in order to avoid the adhesion of pollutants onto the surface of the optical member in the illumination optical system and/or the projection optical system.

(1) A titanium oxide film, which serves as a photocatalyst, is formed on the surface of the optical member corresponding to a portion to which the pollutant tends to adhere so that the organic pollutant is decomposed by the photocatalyst action (see, for example, Japanese Patent Application Laid-open No. 8-313705).

(2) A silicon oxide film is densely formed on the optical member to decrease the surface area of the optical member so that it is tried to decrease the amount of the pollutant. Alternatively, an organic film, which has the carbon fluoride group, is formed on the optical member to decrease the tight contact with respect to the pollutant so that the amount of adhesion of the organic pollutant is decreased (see, for example, Japanese Patent Application Laid-open No. 6-5324).

Conventionally, for example, the following countermeasure has been also adopted. That is, an optical member, to which the pollutant has been adhered, is detached from the illumination optical system or the projection optical system to exchange the optical member.

The following problems are pointed out for the conventional techniques as described above.

At first, in relation to the method for forming the titanium oxide film of (1), the titanium oxide film absorbs the short wavelength laser beam such as the KrF and ArF excimer lasers, although the titanium oxide film have a high transmittance with respect to the relatively long wavelength light beam such as the i-ray (365 nm). Therefore, the titanium oxide film exhibits a fairly low transmittance with respect to the laser beam having the short wavelength as described above. For this reason, the exposure time is prolonged to obtain an appropriate exposure amount, and the throughput is lowered in the projection exposure apparatus which uses the exposure light beam of the KrF or ArF excimer laser beam. Further, in the case of the use for a long period of time, the titanium oxide film begins to be destroyed, for example, due to the heat generated by the light absorption. Therefore, it is necessary to exchange the optical member.

On the other hand, the method for densely forming the silicon oxide film on the optical member of (2) is not preferred so much, because the method causes the change of the characteristics of, for example, the antireflection coating of the optical member. On the other hand, the organic film, which has the carbon fluoride group, absorbs the short wavelength laser beam such as KrF and ArF excimer lasers, although the transmittance is high with respect to the relatively long wavelength light beam such as the i-ray (365 nm) in the same manner as the titanium oxide film. Therefore, the transmittance is lowered. Further, the organic film having the carbon fluoride group itself is decomposed by the radiation of the short wavelength laser as described above.

If the optical member in the projection optical system is exchanged, the following problems arise as well. That is, the cost arises, which is required for the exchange. Further, it takes a certain period of time to adjust the projection optical system after the optical member is exchanged.

In particular, when the pulse laser beam is used, it is also conceived that the method for removing the pollutant such as organic matters adhered to the surface of the optical member is based on the use of the photo-washing in which the pollutant is evaporated by radiating the pulse laser beam. However, a problem arises such that the pollutant, which is formed by a kind of photo-CVD action by the pulse laser beam, is difficult to be removed by the photo-washing. Further, some types of pollutants cannot be removed even by the organic solvent washing with alcohol and/or ketone.

SUMMARY OF THE INVENTION

Taking the foregoing viewpoints into consideration, a first object of the present invention is to provide an exposure technique and a pollutant removal technique capable of quickly removing pollutants adhered to a predetermined optical member in an optical system.

Further, a second object of the present invention is to provide an exposure technique and a pollutant removal technique capable of quickly removing pollutants having been hitherto difficult to be removed even by the photo-washing and the organic solvent washing.

In the present invention, organic and inorganic pollutants adhered to an optical member, which have been incapable of being removed, are effectively removed to restore the transmittances of various optical parts.

A first pollutant removal method according to the present invention comprises a pollutant removal step of removing a pollutant adhered to an optical member by using an etching solution containing hydrofluoric acid, and an etching solution removal step of removing the etching solution from the optical member by using water or an organic solvent.

According to the present invention, the etching solution, which contains hydrofluoric acid for dissolving silicon oxide, is used. Accordingly, dirt matters containing silicon oxide, which have been hitherto incapable of being removed, can be dissolved and removed.

In another aspect, an optical member according to the present invention is an optical member which is treated with the pollutant removal method according to the present invention. The optical member according to the present invention has a high transmittance.

In still another aspect, a first projection exposure apparatus according to the present invention is a projection exposure apparatus which projects a pattern image of a mask (R) onto a substrate (W) to perform exposure with a projection optical system (500); the apparatus comprising an illumination optical system (101) which illuminates the mask with a vacuum ultraviolet light beam as an exposure light beam; and the projection optical system which includes the optical member having a fluoride thin film of the present invention and which forms the pattern image of the mask on the substrate.

In still another aspect, a second projection exposure apparatus according to the present invention is a projection exposure apparatus which projects a pattern image of a mask (R) onto a substrate (W) to perform exposure with a projection optical system (500); the apparatus comprising an illumination optical system (101) which includes the optical member having a fluoride thin film of the present invention and which illuminates the mask with a vacuum ultraviolet light beam as an exposure light beam; and the projection optical system which forms the pattern image of the mask on the substrate.

In still another aspect, a second pollutant removal method according to the present invention is a pollutant removal method for removing a pollutant adhered to a surface of an optical member (20, 32A, 32B) included in an optical system (5, PL); the method comprising a first step (Steps 201, 202) of measuring a predetermined optical characteristic of the optical system to judge whether or not the pollutant adhered to the optical member is to be removed on the basis of a result of the measurement; a second step (Step 205) of removing the pollutant adhered to the optical member by using a predetermined washing solution; a third step (Steps 206, 207) of removing the washing solution from the optical member; and a fourth step (Step 208) of determining information about the pollutant remaining on the optical member.

According to the present invention as described above, for example, the pollutant, which is difficult to be removed with the organic solvent or the like, can be quickly removed by only removing the pollutant from the optical member by using the predetermined washing solution and then removing the washing solution. Further, when the pollutant remains, the pollutant can be reliably removed by repeating the first step and the second step.

In this procedure, it is desirable that an objective surface, from which the pollutant is to be removed, is an outer surface of the optical member (20, 32A, 32B) arranged at an end of the optical system (5, PL); and the first to fourth steps are executed respectively in a state in which the optical member is arranged in the optical system. Accordingly, the pollutant can be quickly removed without detaching the optical member from the optical system.

In still another aspect, a third pollutant removal method according to the present invention is a pollutant removal method for removing a pollutant adhered to a surface of an optical member (20, 32A, 32B) included in an illumination optical system or a projection optical system of an exposure apparatus in which a first object (R) is illuminated with an exposure light beam come from the illumination optical system (5), and a second object (W) is exposed with the exposure light beam via the first object and the projection optical system (PL); the method comprising a first step (Steps 202, 203) of measuring a predetermined optical characteristic of the illumination optical system or the projection optical system to judge whether or not the pollutant adhered to the optical member is to be removed on the basis of a result of the measurement; a second step (Step 205) of removing the pollutant adhered to the optical member by using a predetermined washing solution; a third step (Steps 206, 207) of removing the washing solution from the optical member; and a fourth step (Step 208) of determining information about the pollutant remaining on the optical member.

According to the present invention as described above, for example, the pollutant, which is difficult to be removed by the washing with the organic solvent, can be quickly removed by only removing the pollutant from the optical member by using the predetermined washing solution, and then removing the washing solution. Further, when the pollutant remains, the pollutant can be reliably removed by repeating the first step and the second step.

In this procedure, it is desirable that an objective surface, from which the pollutant is to be removed, is an outer surface of the optical member (20, 32A, 32B) disposed at an end of the projection optical system on a side of the first object or on a side of the second object; and the first to fourth steps are executed respectively in a state in which the optical member is incorporated in the projection optical system. In particular, when the gas such as nitrogen gas and rare gas, through which the exposure light beam is transmissive and from which impurities have been removed exhaustively, is supplied into the projection optical system, the pollutant is adhered in some cases to the outer surface of the optical member disposed at the end of the projection optical system to make contact with the surrounding gas, while no pollutant is adhered to the interior of the projection optical system. In such a situation, according to the present invention, the pollutant can be quickly removed without detaching the optical member from the optical system.

When the optical member is a member (32A) which is disposed at the end of the projection optical system on the side of the first object, it is desirable that the method further comprises a step (Step 204) of detaching the optical member (19, 20) disposed at the end of the illumination optical system on the side of the first object before the second step. The space, which is usable to wash the optical member of the projection optical system, can be secured by detaching the optical member disposed at the end of the illumination optical system. Further, it is enough that the adjustment accuracy may be coarse for the illumination optical system as compared with the projection optical system. Therefore, the illumination optical system can be assembled and adjusted in a short period of time after washing the optical member of the projection optical system.

It is also preferable that the method further comprises a step of exchanging at least a part of the illumination optical system including the optical member (20) which is disposed at the end on the side of the first object and to which the pollutant is adhered. The illumination optical system is assembled and adjusted relatively easily. Therefore, even when the optical member, to which the pollutant is adhered, is exchanged, it is possible to immediately start the exposure step.

When the exposure apparatus is of a scanning exposure type, it is desirable that the second step includes a step of bringing a member soaked with the washing solution into contact with the surface of the optical member so that the member is reciprocated in a non-scanning direction which is perpendicular to a scanning direction for the first object or the second object.

When the pollutant is formed by a certain kind of photo-CVD with the exposure light beam, the pollutant, which is especially adhered to the surface of the optical member disposed closely to the first object or the second object, is adhered to an area which is long substantially in the non-scanning direction in the case of the scanning exposure type. Therefore, the pollutant can be efficiently, removed by only reciprocating the member in the non-scanning direction.

The fourth step includes a step (Step 208) of measuring a reflectance of the surface of the optical member by using, for example, a spectrophotometer. The spectrophotometer can be used to measure, for example, the reflectance. Therefore, it is possible to investigate the degree of the remaining pollutant depending on the level of the reflectance.

The method may further comprise a step of exchanging at least the optical member after periodically executing the first to fourth steps a plurality of times. When the washing is performed periodically as described above, then it is possible to decrease the number of times of the exchange of the optical member, and the throughput of the exposure step is maintained to be high.

In still another aspect, a first pollutant removal apparatus according to the present invention is a pollutant removal apparatus which removes a pollutant adhered to a surface of an optical member (32A) included in an illumination optical system or a projection optical system of an exposure apparatus in which a first object (R) is illuminated with an exposure light beam come from the illumination optical system (5), and a second object (W) is exposed with the exposure light beam via the first object and the projection optical system (PL); the apparatus comprising a cylindrical member (53) which covers at least a part of a space reaching to the surface of the optical member; a support member (56) to which a cleaning member (59A, 59B) soaked with a predetermined washing solution is detachably attached and which is arranged movably along the surface of the optical member to move the cleaning member in a state of making contact with the surface of the optical member; and a rod-shaped member (58) which has at least a part thereof arranged movably in the cylindrical member to move the support member.

According to the present invention as described above, the pollutant can be quickly removed by only moving the support member on the surface of the optical member by the aid of the rod-shaped member.

In still another aspect, a second pollutant removal apparatus according to the present invention is a pollutant removal apparatus which removes a pollutant adhered to a surface of an optical member (20, 32B) included in an illumination optical system or a projection optical system (PL) of an exposure apparatus in which a first object (R) is illuminated with an exposure light beam come from the illumination optical system (5), and a second object (W) is exposed with the exposure light beam via the first object and the projection optical system (PL); the apparatus comprising a support member (67) to which a cleaning member (68) soaked with a predetermined washing solution is detachably attached and which is arranged movably along the surface of the optical member to move the cleaning member in a state of making contact with the surface of the optical member.

According to the present invention as described above, the pollutant can be quickly removed by only moving the support member along the surface of the optical member.

When the exposure apparatus is of a scanning exposure type, it is desirable that the support member is arranged movably in a non-scanning direction which is perpendicular to a scanning direction for the first object or the second object. Accordingly, it is possible to efficiently remove the pollutant which is inherent in the scanning exposure type.

It is desirable that a washing solution-removing member, which is soaked with a solution to remove the washing solution, is also attached detachably to the support member. Accordingly, it is possible to remove the washing solution with ease by using the common support member.

It is desirable that the washing solution, which is to be used in the present invention, contains hydrofluoric acid. Hydrofluoric acid dissolves silicon oxide. Therefore, when the washing solution containing the same is used, it is possible to dissolve and remove the pollutant containing silicon oxide having been hitherto incapable of being removed.

It is desirable that pH of the washing solution is adjusted within a range approximately from 4 to 6 by adding ammonium fluoride to hydrofluoric acid. It is desirable that at least one of water and an organic solvent is used to remove the washing solution. Accordingly, it is established that the washing solution does not harmfully affects, for example, the antireflection film other than the pollutant. Further, it is possible to reliably remove the washing solution after the removal of the pollutant.

The organic solvent is, for example, one of substances of isopropyl alcohol, methanol, ethanol, propanol, butanol, and acetone, or a mixture thereof. It is desirable to use methanol as one which is conveniently usable.

The optical member has, for example, a plurality of thin films which are formed on a surface of a member composed of quartz, fluorite, or optical glass other than the above and which are composed of at least one of fluoride and oxide. That is, the optical member has the film such as the antireflection film formed on the surface. In particular, when silicon oxide is adhered to the surface of the antireflection film due to the action of photo-CVD of the exposure light beam, the reflectance characteristic is deteriorated. Therefore, the present invention is effective therefor.

The fluoride is, for example, at least one of magnesium fluoride, calcium fluoride, aluminum fluoride, cryolite, thiolyte, neodymium fluoride, lanthanum fluoride, gadolinium fluoride, and yttrium fluoride. The oxide is, for example, at least one of aluminum oxide, hafnium oxide, titanium oxide, and zirconium oxide. The outermost surface (thin film) of the optical member is desirably such a fluoride that the fluoride is hardly affected by (hardly dissolved in) the etching solution (BOE) containing hydrofluoric acid.

In still another aspect, a first exposure method according to the present invention is an exposure method for illuminating a first object with an exposure light beam come from an illumination optical system (5) and exposing a second object with the exposure light beam via the first object and a projection optical system (PL); the exposure method comprising using any one of the pollutant removal methods of the present invention to remove the pollutant from the surface of the optical member (20, 32A, 32B) included in the illumination optical system or the projection optical system. According to the present invention, the reflectance or the transmittance of the optical member can be maintained to be in a satisfactory state. Therefore, it is possible to always perform the exposure at a high throughput.

In still another aspect, a first exposure apparatus according to the present invention is an exposure apparatus which illuminates a first object with an exposure light beam come from an illumination optical system (5) and exposes a second object with the exposure light beam via the first object and a projection optical system (PL); wherein any one of the pollutant removal apparatuses of the present invention is capable of being installed to the exposure apparatus to remove the pollutant from the surface of the optical member (20, 32A, 32B) included in the illumination optical system or the projection optical system. According to the present invention, it is possible to quickly remove the pollutant without detaching the optical member.

In still another aspect, a fourth pollutant removal method according to the present invention is a pollutant removal method for removing a pollutant adhered to a surface of an optical member (20, 32A, 32B) of an optical system (5, PL) through which an exposure light beam passes in an exposure apparatus which exposes a second object (W) with the exposure light beam via a first object (R) having a pattern; the method comprising exchanging at least the optical member after executing an operation of removal of the pollutant and a washing solution periodically a plurality of times, the operation including removing the pollutant adhered to the optical member by using the predetermined washing solution and removing the washing solution from the optical member.

According to the present invention, the pollutant, which is difficult to be removed, for example, with the organic solvent, can be quickly removed from the optical member. Further, it is possible to decrease the number of times of the exchange of the optical member by periodically performing the washing.

In this procedure, it is desirable that an optical characteristic of the optical system is measured, and it is judged whether or not removal of the pollutant is required on the basis of a result of the measurement.

It is also preferable that information about a flare generated in the optical system is measured, and the pollutant adhered to the optical member is removed when the flare exceeds an allowable value. For example, when the flare is generated by the pollutant, it is possible to reduce the flare by removing the pollutant.

In still another aspect, a fifth pollutant removal method according to the present invention is a pollutant removal method for removing a pollutant adhered to a surface of an optical member (20, 32A, 32B) of an optical system (5, PL) through which an exposure light beam passes in an exposure apparatus which exposes a second object (W) with the exposure light beam via a first object (R) having a pattern; the method comprising measuring information about a flare generated in the optical system, wherein the pollutant adhered to the optical member is removed by using a predetermined washing solution when the flare exceeds an allowable range, and the washing solution is removed from the optical member.

According to the present invention, when the flare is generated by the pollutant, it is possible to quickly reduce the flare by removing the pollutant.

In this procedure, it is desirable that information about the pollutant remaining on the optical member is determined after the removal, or a reflectance of the surface of the optical member is measured after the removal.

In still another aspect, a sixth pollutant removal method according to the present invention is a pollutant removal method for removing a pollutant adhered to a surface of an optical member (20, 32A, 32B) of an optical system (5, PL) through which an exposure light beam passes in an exposure apparatus which exposes a second object (W) with the exposure light beam via a first object (R) having a pattern; the method comprising a first step (Steps 205 to 207) of removing the pollutant adhered to the optical member by using a predetermined washing solution and removing the washing solution from the optical member; and a second step (Step 208) of measuring a reflectance of the surface of the optical member after the removal.

According to the present invention, it is possible to remove the pollutant quickly and reliably, for example, by repeating the first step depending on the measured value of the reflectance.

In this procedure, it is desirable that a spectrophotometer is used to measure the reflectance of the surface of the optical member.

It is desirable that the washing solution contains hydrofluoric acid. Accordingly, it is possible to dissolve and remove the pollutant containing silicon oxide.

It is desirable that ammonium fluoride is added to hydrofluoric acid in the washing solution. It is desirable that pH of the washing solution is about 4 to 6. Accordingly, it is established that the washing solution does not harmfully affects, for example, the antireflection film other than the pollutant. It is desirable that at least one of water and an organic solvent is used to remove the washing solution from the optical member.

For example, the optical system includes a projection optical system which projects a pattern image of the first object onto the second object, and the optical member, from which the pollutant adhered to the surface is to be removed, is provided for at least one side of the projection optical system.

It is desirable that the optical member, from which the pollutant adhered to the surface is to be removed, is provided, for example, at least at one end of the projection optical system on a side of the first object, the optical system includes an illumination optical system which radiates the exposure light beam onto the first object, and the pollutant is removed after detaching a part of the illumination optical system arranged on the side of the first object.

The optical member, from which the pollutant adhered to the surface is to be removed, may be provided, for example, at least at one end of the projection optical system on a side of the first object, and the pollutant is removed after detaching at least a movable member of a stage system which includes the movable member (22) which holds the first object. By detaching the movable member, the removing operation can be performed easily.

When the exposure apparatus is of a scanning exposure type which synchronously moves the first object and the second object, it is desirable that a member, which is soaked with the washing solution, is reciprocated in a non-scanning direction perpendicular to a scanning direction in which the synchronous movement is performed while bringing the member into contact with the surface of the optical member to remove the pollutant from the optical member. In the case of the scanning exposure type, the pollutant is sometimes deposited in an area which is long in the non-scanning direction on the surface of the optical member. Therefore, the pollutant can be efficiently removed by effecting the reciprocating motion in the non-scanning direction.

For example, a gas, in which the exposure light beam is attenuated to a smaller extent as compared with air, is supplied into the optical system, and an objective surface, from which the pollutant is to be removed, includes an outer surface of the optical member provided at least at one end of the optical system.

In the case of another example, the optical system includes an illumination optical system which radiates the exposure light beam onto the first object, and the optical member (20), from which the pollutant adhered to the surface is to be removed, is provided at one end of the illumination optical system on a side of the first object.

It is also preferable that the optical system includes an illumination optical system which radiates the exposure light beam onto the first object, and a part of the illumination optical system, which includes at least the optical member (20) adhered with the pollutant and disposed at an end on a side of the first object, is exchanged. The part of the illumination optical system, which is to be subjected to the exchange, includes, for example, a condenser lens.

The optical member, from which the pollutant adhered to the surface is to be removed, has a plurality of thin films which are formed on the surface and which are composed of, for example, at least one of fluoride and oxide. When the thin film is an antireflection film, the reflectance characteristic is deteriorated, if the film of the pollutant is formed thereon. However, the reflectance characteristic can be improved by removing the pollutant.

The optical member, from which the pollutant adhered to the surface is to be removed, is, for example, a plane parallel plate. In the case of the plane parallel plate, the removing operation can be performed easily and reliably.

The exposure light beam has, for example, a wavelength of not more than about 200 nm. In this case, the pollutant tends to be formed. Therefore, the effect of the present invention is enhanced.

The exposure apparatus is installed, for example, in a clean room in a device-producing factory, and the pollutant is removed while stopping operation of the exposure apparatus. According to the present invention, the operation for removing the pollutant is executed in a short period of time. Therefore, the period, in which the operation is stopped, can be shortened.

In still another aspect, a second exposure method according to the present invention comprises a step of removing a pollutant adhered to a surface of an optical member by using any one of the pollutant removal methods of the present invention, wherein the second object is exposed with the exposure light beam via the first object.

In still another aspect, a method for producing a device according to the present invention comprises a step of transferring a device pattern (R) onto a sensitive object (W) by using the exposure method of the present invention. The throughput is always maintained to be high by applying the present invention.

DESCRIPTION OF THE PREFERRED EMBODIMENTS OF THE INVENTION

First Embodiment of the Present Invention

A first embodiment of the present invention will be explained below with reference to FIGS. 1 to 3.

EXAMPLE 1

In relation to a projection exposure apparatus based on the use of the ArF excimer laser, it is known that siloxane-based dirt components are decomposed and synthesized by the laser beam on the lens surface disposed most closely to the stage, and the silicon oxide film is deposited over a long period of time. The silicon oxide film is composed of pure $SiO_2$, which is a deposit having no absorbance even in the deep ultraviolet region. However, if the silicon oxide film, which has a different refractive index, is deposited on the antireflection film, the reflection characteristic is deteriorated.

Figure 1:
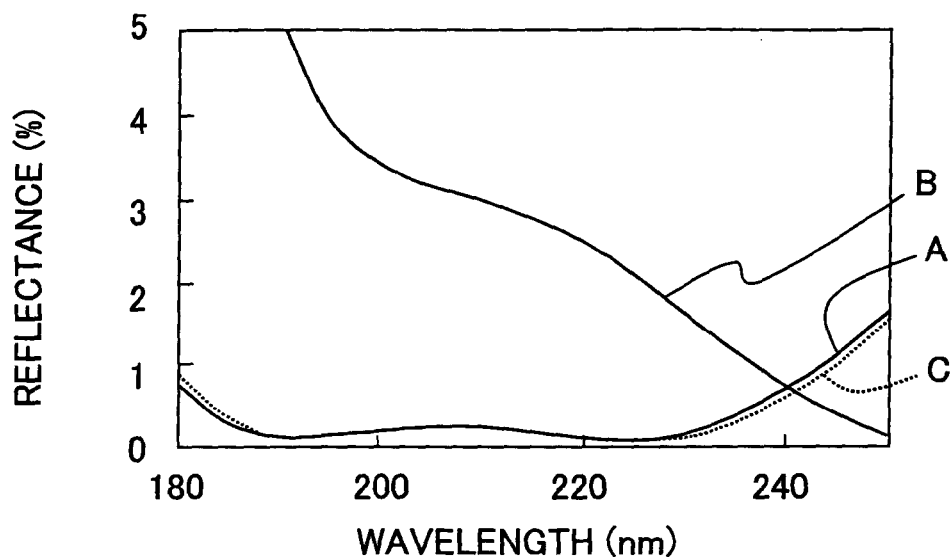
FIG. 1 shows various reflectance characteristics of the optical member.

FIG. 1 shows the wavelength and the reflectance of the optical member. In FIG. 1, curves A, B, and C indicate the reflectance characteristics of an optical member A having a wide zone antireflection film ($MgF_2/LaF_3/MgF_2/LaF_3/MgF_2/LaF_3$) applied onto a quartz substrate, a member B obtained by adhering the dirt on the optical member A, and a member C obtained by treating the member B by the pollutant removal method of the present invention respectively. Specifically, the dirt is a deposit having a thickness of 10 nm deposited with silicon oxide by the laser beam. As shown in FIG. 1, the following reflectances are obtained at the wavelength (193 nm) of the ArF excimer laser. That is, the reflectance of the member A is 0.1%, the reflectance of the member B is 4%, and the reflectance of the member C is 0.1%.

On this condition, an etching solution containing hydrofluoric acid of the present invention was used to remove the silicon oxide pollutant, and then the etching solution containing hydrofluoric acid was washed out with water and methanol. The components of the employed etching solution are as follows. That is, an aqueous solution of hydrofluoric acid (HF, 50% by weight) and ammonium fluoride ($NH_4F$, 40% by weight) were mixed at a volume ratio of 1:10. In the following description, the solution, which is obtained by mixing the aqueous solution of hydrofluoric acid (HF, 50% by weight) and the ammonium fluoride ($NH_4F$, 40% by weight) at the volume ratio of 1:10 in the present invention, is referred to as "BOE (buffered oxide etch)". The reason, why ammonium fluoride is mixed, is that no harmful influence is to be exerted, for example, on the magnesium fluoride layer and lanthanum fluoride layer of the optical thin film and the fluorite as the substrate other than silicon oxide by adjusting pH. As for pH, pH=4 to pH=6 is appropriate, and approximately pH=5 is most appropriate.

A wiping cloth made of polypropylene was soaked with BOE described above, and the optical member was wiped for 10 seconds to 60 seconds to remove the silicon oxide pollutant. The etching rate of BOE with respect to silicon oxide is about 70 nm/min at 25° C. Therefore, a period of 10 seconds is sufficient to remove 10 nm of silicon oxide. The etching rate herein refers to the amount (depth) to dissolve silicon oxide per 1 minute. After that, the optical member is washed with water to wash out BOE so that any remaining component does not exert any harmful influence on the optical thin film and the substrate.

As a result of the measurement of the spectroscopic characteristic, as appreciated from the curve C shown in FIG. 1, the reflection characteristic was completely restored to the original satisfactory reflectance value of 0.1% at the wavelength (193 nm) of the ArF excimer laser. Further, as shown in FIG. 1, the reflection characteristic was completely restored to the original satisfactory reflectance in a wavelength region of 180 nm to 250 nm. Accordingly, it is understood that only the silicon oxide pollutant was successfully removed without harmfully affecting the optical thin film and the optical member. Additionally, the transmittance characteristic and the surface roughness were also equivalent to the characteristics of the original wide zone antireflection film.

In this example, the mixing ratio of hydrofluoric acid and ammonium fluoride was 1:10. However, no great difference appears even when the mixing ratio is changed. No problem arises even when hydrogen fluoride is further diluted with water.

When it is known that the pollutant includes only silicon oxide as described above, the mixed solution of hydrofluoric acid and ammonium fluoride exhibits the sufficient effect.

EXAMPLE 2

However, the effect is insufficient in relation to the dirt when the pollutant includes organic substances such as hydrocarbon and inorganic substances such as ammonium sulfate. Accordingly, an etching solution (BOE/IPA) was prepared, which was obtained by mixing, at a ratio of 1:1, isopropyl alcohol and BOE obtained by mixing hydrofluoric acid (HF, 50% by weight) and ammonium fluoride ($NH_4F$, 40% by weight) at a volume ratio of 1:10, for the following reason. That is, hydrocarbon is dissolved in isopropyl alcohol, ammonium sulfate is dissolved in water, and silicon oxide is dissolved in hydrofluoric acid. Therefore, when BOE/IPA is used as the etching solution, it is possible to quickly remove a variety of pollutants.

The dirt, which was actually generated in a relay unit (optical system) for carrying the excimer laser from a laser light source to a projection lens in a projection exposure apparatus based on the use of the KrF excimer laser, was tried to be removed with BOE/IPA. FIG. 2 shows the wavelength and the transmittance of the optical member. In FIG. 2, curves D, E, and F indicate the transmittance distributions of an optical member D having an antireflection film ($MgF_2/NdF_3/MgF_2$) applied onto a quartz substrate, a member E obtained by adhering the dirt on the optical member D, and a member F obtained by treating the member E by the pollutant removal method of the present invention respectively. Specifically, the dirt is a mixed deposit having a thickness of 5 nm deposited with organic dirt and silicon oxide by the laser beam. As shown in FIG. 2, the following transmittances are obtained at the wavelength (248 nm) of the KrF excimer laser. That is, the transmittance of the member D is 100%, the transmittance of the member E is 72%, and the transmittance of the member F is 99%. It is postulated that the cause of the dirt is the mixture of hydrocarbon and silicon oxide. The optical member was immersed for 60 seconds in a beaker filled with BOE/IPA to dissolve the pollutant, and then BOE/IPA was washed out with pure water and methanol.

Figure 2:
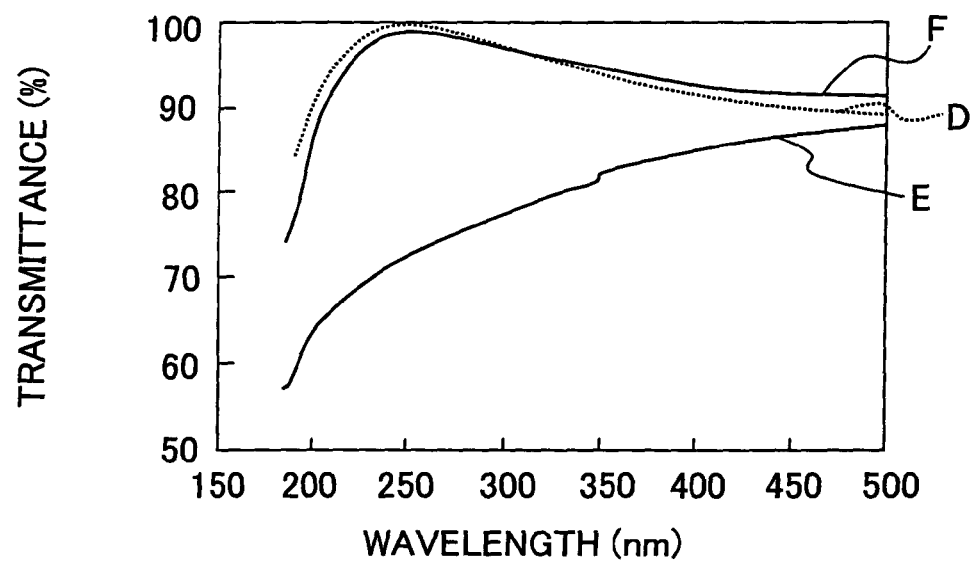
FIG. 2 shows various transmittance characteristics of the optical member.

As appreciated from FIG. 2, the transmittance at the wavelength of 248 nm of the curve F after the removal was restored to not less than 99%, and the spectroscopic characteristic was restored to the original characteristic as well. Additionally, the reflection and the surface roughness were also equivalent to the characteristics of the original optical member. Further, as shown in FIG. 2, the transmittance characteristic in a wavelength region of 190 nm to 400 nm was completely restored to the original satisfactory transmittance distribution. Accordingly, it is understood that only the pollution was successfully removed without exerting any harmful influence on the optical thin film and the substrate.

In this embodiment, the substrate was quarts. However, there is no limitation thereto. It is also allowable to use fluorite or other optical glasses. The organic solvent was isopropyl alcohol. However, there is no limitation thereto. It is also allowable to use methanol, ethanol, propanol, butanol, or acetone.

The antireflection film may be constructed as the film of at least one of magnesium fluoride, calcium fluoride, aluminum fluoride, cryolite, thiolyte, neodymium fluoride, lanthanum fluoride, gadolinium fluoride, yttrium fluoride, silicon oxide, aluminum oxide, hafnium oxide, titanium oxide, and zirconium oxide. It is desirable that the outermost surface (thin film) of the optical member is composed of fluoride which is hardly affected by (hardly dissolved in) the etching solution (BOE) containing hydrofluoric acid.

EXAMPLE 3

Next, an example of the projection exposure apparatus of the present invention will be explained.

Figure 3:
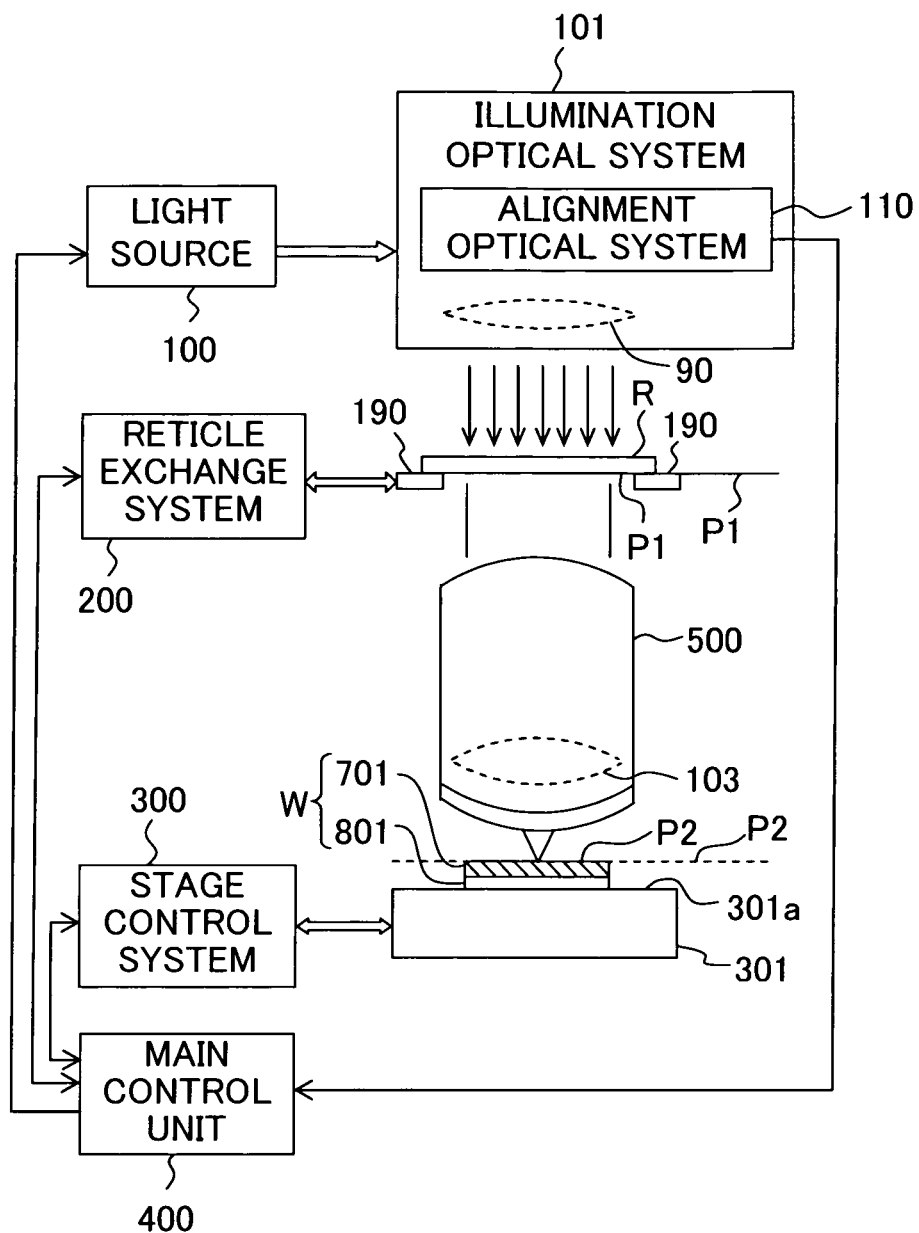
FIG. 3 shows a basic arrangement of a projection exposure apparatus according to a first embodiment of the present invention.

FIG. 3 shows a basic structure of the projection exposure apparatus based on the use of the optical member to which the pollutant removal method according to the present invention is applied. The present invention is especially applicable to the projection exposure apparatus called "stepper" or "scanner" in order to project an image of a pattern of a reticle onto a wafer coated with a photoresist.

As shown in FIG. 3, the projection exposure apparatus of this embodiment comprises at least a substrate stage (wafer stage) 301 which has a surface 301a for placing thereon a photosensitive substrate (hereinafter simply referred to as "substrate") W applied with a photosensitive agent (photoresist) 701 on a surface of a substrate (wafer or the like) 801, an illumination optical system 101 which radiates a vacuum ultraviolet light beam having a wavelength prepared as an exposure light beam and which transfers a pattern of a prepared mask (hereinafter referred to as "reticle") R onto the substrate W, a light source 100 which supplies the exposure light beam to the illumination optical system 101, and a projection optical system 500 which is placed on an optical path for allowing the exposure light beam to pass therethrough between the reticle R and the substrate W and which has a first plane (object plane) P1 for arranging a lower surface (pattern surface) of the reticle R formed with the pattern and a second plane (image plane) P2 for arranging a surface of the substrate W (photosensitive layer) 701 in order to project the image of the pattern of the reticle R onto the substrate W. In FIG. 3, P1 represents both of the first plane and the pattern plane of the reticle R, and P2 represents both of the second plane and the surface of the substrate W. An alignment optical system 110 is also provided, wherein the exposure light beam, which passes through the illumination optical system 101, is branched so that the exposure light beam is used as an alignment light beam in order to adjust the relative position between the reticle R and the substrate W. The reticle R is arranged on a reticle stage 190 which is movable in parallel to the first plane P1 of the projection optical system 500. A reticle exchange system 200 exchanges and carries the reticle R set on the reticle stage 190, and the reticle exchange system 200 includes, for example, a stage driver (for example, a linear motor) for driving the reticle stage 190. Although not shown, an alignment optical system based on the off-axis system is also provided, which is installed separately from the projection optical system 500 to detect an alignment mark on the substrate W by using an alignment light beam having a wavelength different from that of the exposure light beam. A stage control system 300 includes, for example, a stage driver (for example, a linear motor) for driving the wafer stage 301. A main control unit 400, to which, for example, the result of the detection by the alignment optical system is outputted, collectively controls the entire apparatus including those represented, for example, by the light source 100, the reticle exchange system 200, and the stage control system 300.

The projection exposure apparatus of this embodiment uses the optical member to which the pollutant removal method of this embodiment is applied. Specifically, the projection exposure apparatus of this embodiment shown in FIG. 3 is capable of possessing the optical member from which the pollutant is removed by the method of this embodiment as the optical lens 90 of the illumination optical system 101 and/or the optical lens 103 of the projection optical system 500.

In this embodiment, it is assumed that the pollutant has been removed for at least one of a plurality of optical members for constructing the illumination optical system 101 or the projection optical system 500. However, for example, when the interior of the illumination optical system 101 or the projection optical system 500 is purged with the gas (for example, inert gas such as nitrogen or helium) in which the transmittance of the exposure light beam is high and the impurities have been removed exhaustively, it is preferable to remove the pollutant from the optical member having a certain surface exposed to the exterior atmosphere, i.e., the optical member of the illumination optical system 101 arranged at one end thereof (disposed most closely to the reticle R) and/or the optical members of the projection optical system 500 disposed at both ends thereof. In this embodiment, the optical member, from which the pollutant is to be removed, is not limited to the optical lens (lens element). It is also allowable to select those other than the above, including, for example, an aberration-correcting member and a plane parallel plate (cover glass plate).

Second Embodiment of the Present Invention

A second embodiment of the present invention will be explained below with reference to FIGS. 4 to 12.

Figure 5:
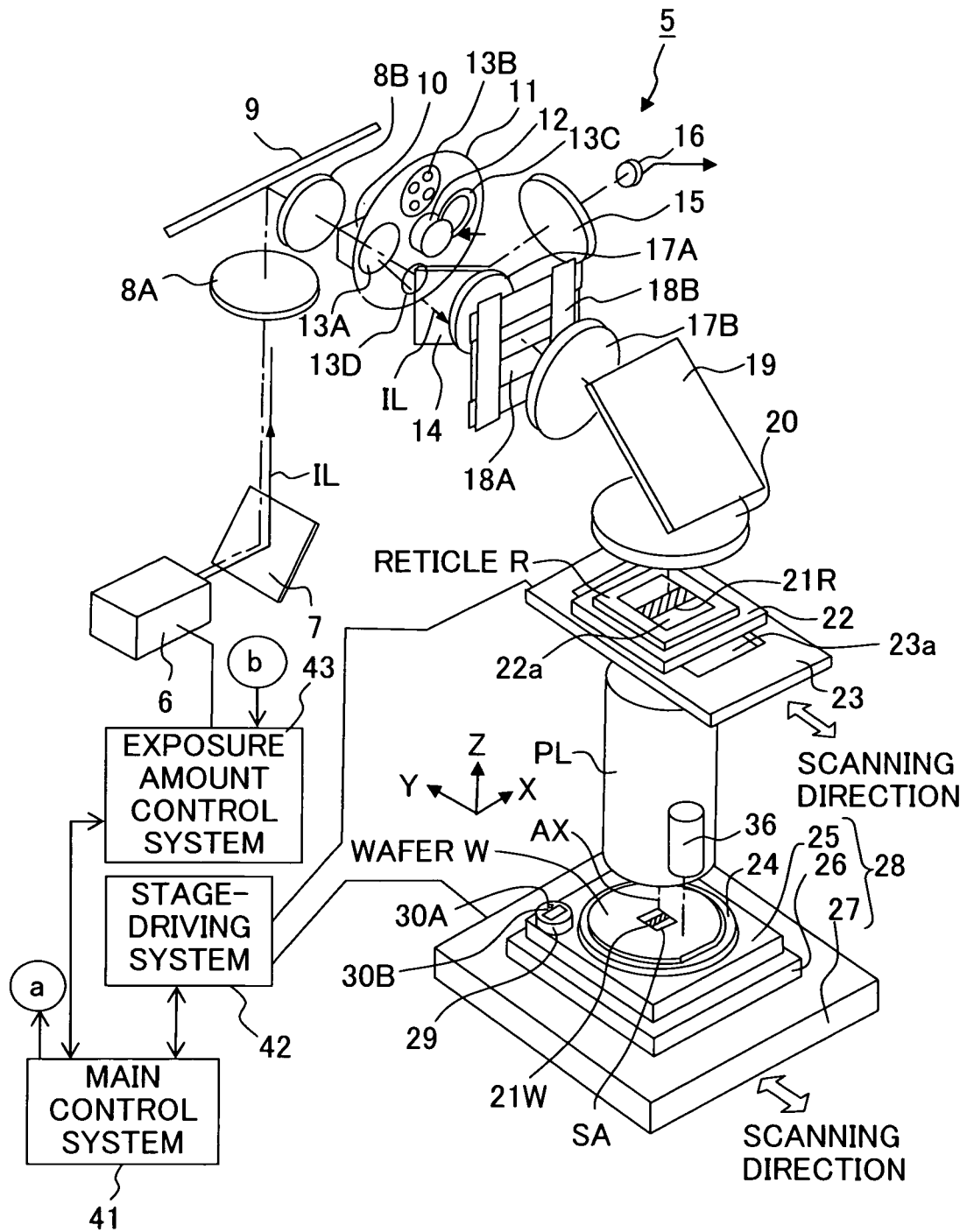
FIG. 5 shows a perspective view illustrating the projection exposure apparatus according to the second embodiment of the present invention.

FIG. 5 shows a schematic arrangement of a projection exposure apparatus of the scanning exposure type of this embodiment. In FIG. 5, the ArF excimer laser light source (wavelength: 193 nm) is used as an exposure light source 6. Those usable as the exposure light source also include, for example, ultraviolet pulse laser light sources such as the KrF excimer laser light source (wavelength: 247 nm), the $F_2$ laser light source (wavelength 157 nm), the $Kr_2$ laser light source (wavelength: 146 nm), and the $Ar_2$ laser light source (wavelength: 126 nm); high harmonic wave-generating light sources of the YAG laser; high harmonic wave-generating apparatuses such as the solid laser (semiconductor laser or the like); and mercury lamps (i-ray or the like).

The exposure light beam (illumination light beam for the exposure) IL, which serves as the exposure light beam pulse-emitted from the exposure light source 6 during the exposure, passes along a mirror 7, an unillustrated beam-shaping optical system, a first lens 8A, a mirror 9, and a second lens 8B, while the cross-sectional shape is shaped into a predetermined shape. The exposure light beam IL comes into a fly's eye lens 10 as an optical integrator (uniformizer or homogenizer), and the illuminance distribution is uniformized. An illumination system aperture diaphragm member 11, which has aperture diaphragms (σ diaphragms) 13A, 13B, 13C, 13D to determine the illumination condition by setting the light amount distribution of the exposure light beam, for example, to a plurality of eccentric areas and zonal shapes, are arranged rotatably by a driving motor 12 on the outgoing plane of the fly's eye lens 10 (pupil plane of the illumination optical system). The exposure light beam IL, which has passed through the aperture diaphragm included in the illumination system aperture diaphragm member 11, passes along a beam splitter 14 having a small reflectance and a relay lens 17A. The exposure light beam IL successively passes along a fixed blind 18A as a fixed field diaphragm and a movable blind 18B as a movable field diaphragm. In this embodiment, the movable blind 18B is arranged on the plane which is approximately conjugate with the pattern plane (reticle plane) of the reticle R as the mask. The fixed blind 18A is arranged on the plane which is slightly defocused from the plane that is conjugate with the reticle plane.

The fixed blind 18A is used in order that the illumination area 21R of the reticle plane is defined to be a slit-shaped area which is long in the non-scanning direction perpendicular to the scanning direction of the reticle R. The movable blind 18B is provided with two pairs of blades which are relatively movable respectively in the directions corresponding to the scanning direction and the non-scanning direction of the reticle R. The movable blind 18B is used in order that the illumination area is closed in the scanning direction so that the exposure is not performed for unnecessary portions upon the start and the end of the scanning exposure for each of shot areas as the exposure objective. Further, the movable blind 18B is also used to define the width and the center of the illumination area in the non-scanning direction. The exposure light beam IL, which has passed through the blinds 18A, 18B, passes along a sub-condenser lens 17B, an optical path-bending mirror 19, and a main condenser lens 20 to illuminate the illumination area 21R in the pattern area of the reticle R as the mask with the uniform illuminance distribution.

On the other hand, the exposure light beam, which is reflected by the beam splitter 14, is received via a light-collecting lens 15 by an integrator sensor 16 which is composed of a photoelectric sensor. A detection signal of the integrator sensor 16 is supplied to an exposure amount control system 43. The exposure amount control system 43 indirectly calculates the exposure energy on the wafer W by using the detection signal and the previously measured transmittance of the optical system running from the beam splitter 14 to the wafer W as the substrate (photosensitive substrate). The exposure amount control system 43 controls the light emission operation of the exposure light source 6 so that a proper exposure amount is obtained on the wafer W on the basis of the accumulated value of the calculation results and the control information fed from the main control system 41 which collectively controls the operation of the entire apparatus. The illumination optical system 5 is constructed, including the mirrors 7, 9, the lenses 8A, 8B, the fly's eye lens 10, the illumination system aperture diaphragm member 11, the beam splitter 14, the relay lens 17A, the blinds 18A, 18B, the sub-condenser lens 17B, the mirror 19, and the main condenser lens 20.

With the exposure light beam IL, the pattern in the illumination area 21R of the reticle R is projected onto the slit-shaped exposure area 21W which is long in the non-scanning direction on one shot area SA on the wafer W applied with the photoresist at a projection magnification $\beta$ ($\beta$ is, for example, ¼ or ⅕) via the projection optical system PL which is telecentric on the both sides. The wafer W is a disk-shaped substrate having a diameter of about 200 to 300 mm composed of, for example, a semiconductor (for example, silicon) or SOI (silicon on insulator). The reticle R and the wafer W correspond to the first object and the second object (sensitive object) respectively. The following explanation will be made assuming that Z axis extends in parallel to the optical axis AX of the projection optical system PL, the X axis extends in the non-scanning direction perpendicular to the scanning direction of the reticle R and the wafer W during the scanning exposure in the plane perpendicular to the Z axis, and the Y axis extends in the scanning direction as shown in FIG. 5.

At first, the reticle R is held on the reticle stage (movable member) 22. The reticle stage 22 is movable at a constant velocity in the Y direction on the reticle base 23. Further, the reticle stage 22 is finely movable in the X direction, the Y direction, and the direction of rotation so that the synchronous error is corrected to perform the scanning for the reticle R. The position of the reticle stage 22 is measured by a laser interferometer (not shown) and a movement mirror (not shown) provided thereon. The stage-driving system 42 controls the velocity and the position of the reticle stage 22 by the aid of an unillustrated actuator (for example, a linear motor) on the basis of the measured value and the control information fed from the main control system 41. In this embodiment, the reticle stage system is constructed by the reticle stage 22, the stage-driving system 42, the actuator, and the laser interferometer as described above. Openings 22a, 23a (see FIG. 5) are formed for the reticle stage 22 and the reticle base 23 in order to allow the exposure light beam IL to pass therethrough respectively. A reticle alignment microscope (not shown) for the reticle alignment is arranged over the circumferential portion of the reticle R. Although not shown, a reticle loader for exchanging the reticle on the reticle stage 22 and a reticle library for accommodating a plurality of reticles are installed in the vicinity of the reticle stage 22.

On the other hand, the wafer W is held on the wafer stage 28 by the aid of the wafer holder 24. The wafer stage 28 is movable at a constant velocity in the Y direction on the wafer base 27. The wafer stage 28 includes an XY stage 26 for making stepping movement in the X direction and the Y direction, and a Z tilt stage 25. The Z tilt stage 25 performs the focusing and the leveling for the wafer W on the basis of the measured value of the position of the wafer W in the Z direction obtained by an unillustrated autofocus sensor. The position of the wafer stage 28 in the XY plane is measured by a laser interferometer (not shown). The stage-driving system 42 controls the operation of the wafer stage 28 by the aid of an unillustrated actuator (for example, a linear motor) on the basis of the measured value and the control information fed from the main control system 41. In this embodiment, the wafer stage system is constructed by the wafer holder 24, the wafer stage (movable member) 28, the stage-driving system 42, the actuator, and the laser interferometer as described above. The wafer stage 28 is retracted from the position disposed just under the projection optical system PL during the pollutant removal as described later on so that the operation space is secured.

A light amount sensor section 29, which includes a radiation amount monitor having a light-receiving surface 30B larger than the exposure area 21W and an illuminance sensor having a pin hole-shaped light-receiving surface 30A, is fixed in the vicinity of the wafer W on the wafer stage 28. Two detection signals of the light amount sensor section 29 are supplied to the exposure amount control system. An alignment sensor 36 based on the off-axis system, which is used for the wafer alignment, is arranged over the wafer stage 28. The main control system 41 performs the alignment for the wafer W on the basis of the result of the detection.

During the exposure, the operation for driving the reticle stage 22 and the wafer stage 28 to synchronously scan the reticle R and one shot area on the wafer W in the Y direction in a state of being irradiated with the exposure light beam IL, and the operation for driving the wafer stage 28 to perform the stepping movement of the wafer W in the X direction and the Y direction are repeated. Accordingly, each of the shot areas on the wafer W is exposed with the pattern image of the reticle R in accordance with the step-and-scan system.

In this embodiment, the ArF excimer laser light beam is used as the exposure light beam IL. When the ultraviolet pulse laser beam such as the ArF or KrF excimer laser is used as the exposure light beam as described above, it is known that the following phenomenon occurs. That is, the siloxane-based dirt components are decomposed by the laser beam, and the silicon oxide film (pure $SiO_2$) as the pollutant is gradually synthesized and deposited for a long period of time on the surface (especially on the outer surface) of the optical member (for example, the lens or the plane parallel plate) of the projection optical system PL disposed most closely to the wafer and the reticle in accordance with a kind of photo-CVD (Chemical Vapor Deposition) action. The silicon oxide film as a simple substance is such a deposit that substantially no absorption is caused by the exposure light beam in the vacuum ultraviolet region as well. However, the antireflection film is formed on the surface of the ordinary optical member for the exposure apparatus. When the silicon oxide film, which is different in the refractive index, is deposited on the antireflection film, it is feared that the reflection characteristic of the optical member may be deteriorated, the transmittance may be lowered, and the flare may be generated merely slightly.

FIG. 1 shows the relationship between the wavelength and the reflectance of the optical member. In FIG. 1, the curve A represents the reflectance of the optical member having a wide zone antireflection film for the ArF excimer laser ($MgF_2/LaF_3/MgF_2/LaF_3/MgF_2/LaF_3$) applied onto a quartz substrate, and the curve B represents the reflectance of the member obtained by adhering the dirt of the silicon oxide film having a thickness of 10 nm on the optical member A. As shown in FIG. 1, the reflectance of the optical member itself is 0.1% (curve A), and the reflectance obtained by adhering the silicon oxide film on the optical member is 4% (curve B) at the wavelength (193 nm) of the ArF excimer laser. The reflectance is greatly lowered by the silicon oxide film.

With reference to FIG. 5, when the ArF excimer laser is used as the exposure light beam IL, the illumination optical system 5 is covered with a sub-chamber 4 (see FIG. 4) in an approximately air-tight state in order to avoid any absorption by oxygen or the like. The gas (hereinafter referred to as "purge gas") such as the nitrogen gas (or the rare gas such as helium is also usable), from which impurities have been exhaustively removed and in which the exposure light beam IL is attenuated to a less extent as compared with the air (i.e., the possessed transmittance is higher than that of the air with respect to the exposure light beam IL), is supplied into the sub-chamber 4. Similarly, the purge gas, from which impurities have been exhaustively removed, is also supplied into the barrel of the projection optical system PL. The purge gas may be enclosed in the illumination optical system 5 and the projection optical system PL respectively, and the purge gas may be periodically exchanged. Alternatively, the purge gas may be supplied and discharged approximately simultaneously. Further alternatively, the purge gas may be merely supplied without forcibly discharging the purge gas. Therefore, the pollutant is slightly deposited on the optical members disposed at the inside of the illumination optical system 5 and the projection optical system PL. The optical members, for which the deposition of the pollutant arises any problem, include the optical member of the projection optical system PL disposed on the side nearest to the wafer (hereinafter referred to as "lower end lens"), the optical member disposed on the side nearest to the reticle (hereinafter referred to as "upper end lens"), and the main condenser lens 20 as the optical member of the illumination optical system 5 disposed on the side nearest to the reticle. Further, the pollutant deposition occurs due to the contact with the atmospheric gas containing any impurity. Therefore, it is considered that the pollutant deposition occurs, in most cases, on the lower end lens 32B (see FIG. 4), the upper end lens 32A (see FIG. 4), and the respective outer surfaces of the main condenser lens 20 (surfaces to make contact with the external gas, for example, the air incorporated via a chemical filter or the like from a clean room in which the projection exposure apparatus shown in FIG. 5 is installed, or the dry air as described later on).

Accordingly, in this embodiment, the pollutant, which is generated on the outer surface of the optical member disposed at the end of the optical system as described above, is removed without detaching the optical member from the optical system as described below. For this purpose, it is firstly necessary to judge whether or not the amount of the pollutant on the optical member exceeds the allowable range. The most simple method is as follows. That is, with reference to FIG. 5, the wafer stage 28 is driven to move the light-receiving section 30B of the light amount sensor section 29 to the exposure area 21W so that the output of the integrator sensor 16 is compared with the output of the radiation amount monitor having the light-receiving section 30B to monitor the transmittance of the optical system running from the beam splitter 14 to the wafer stage 28. For example, the transmittance is periodically monitored. If the transmittance is gradually lowered to be lower than the predetermined allowable range, it can be judged that the removal of the pollutant is required to be performed.

An explanation will be made below with reference to a flow chart shown in FIGS. 7A and 7B about an example as another method of the operation to be performed when the degree of pollution is monitored while monitoring the flare of the optical system, and the pollutant is removed from the lower end and upper end lenses of the projection optical system PL on the basis of an obtained result.

Figure 6A:
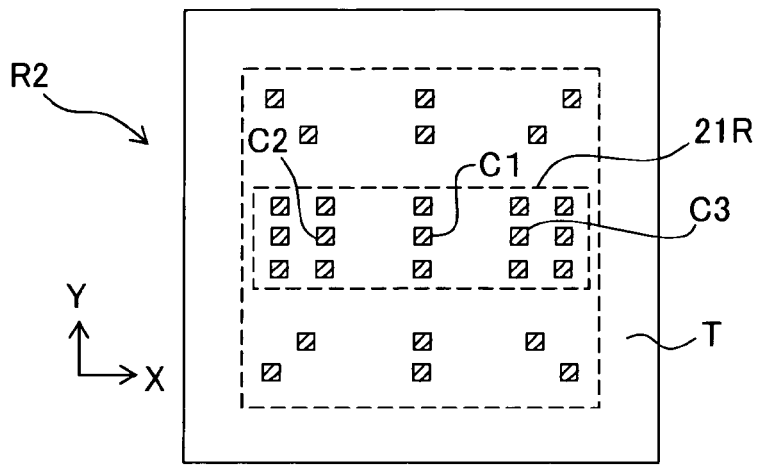
FIGS. 6A to 6C illustrate a procedure to measure the flare of a projection optical system.
Figure 7A:
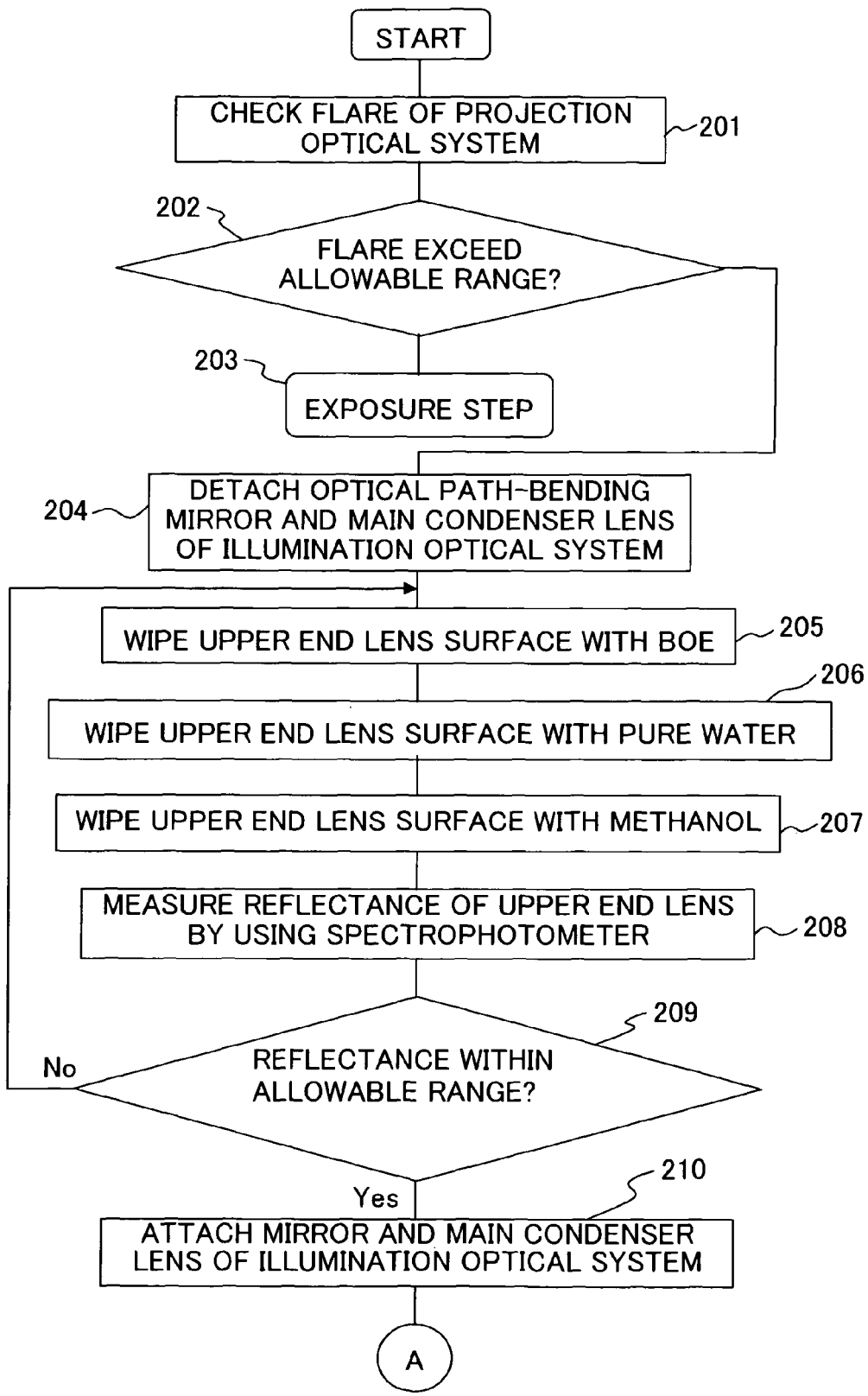
FIGS. 7A and 7B show a flow chart illustrating an example of the operation for removing the pollutant in the second embodiment.
Figure 7B:
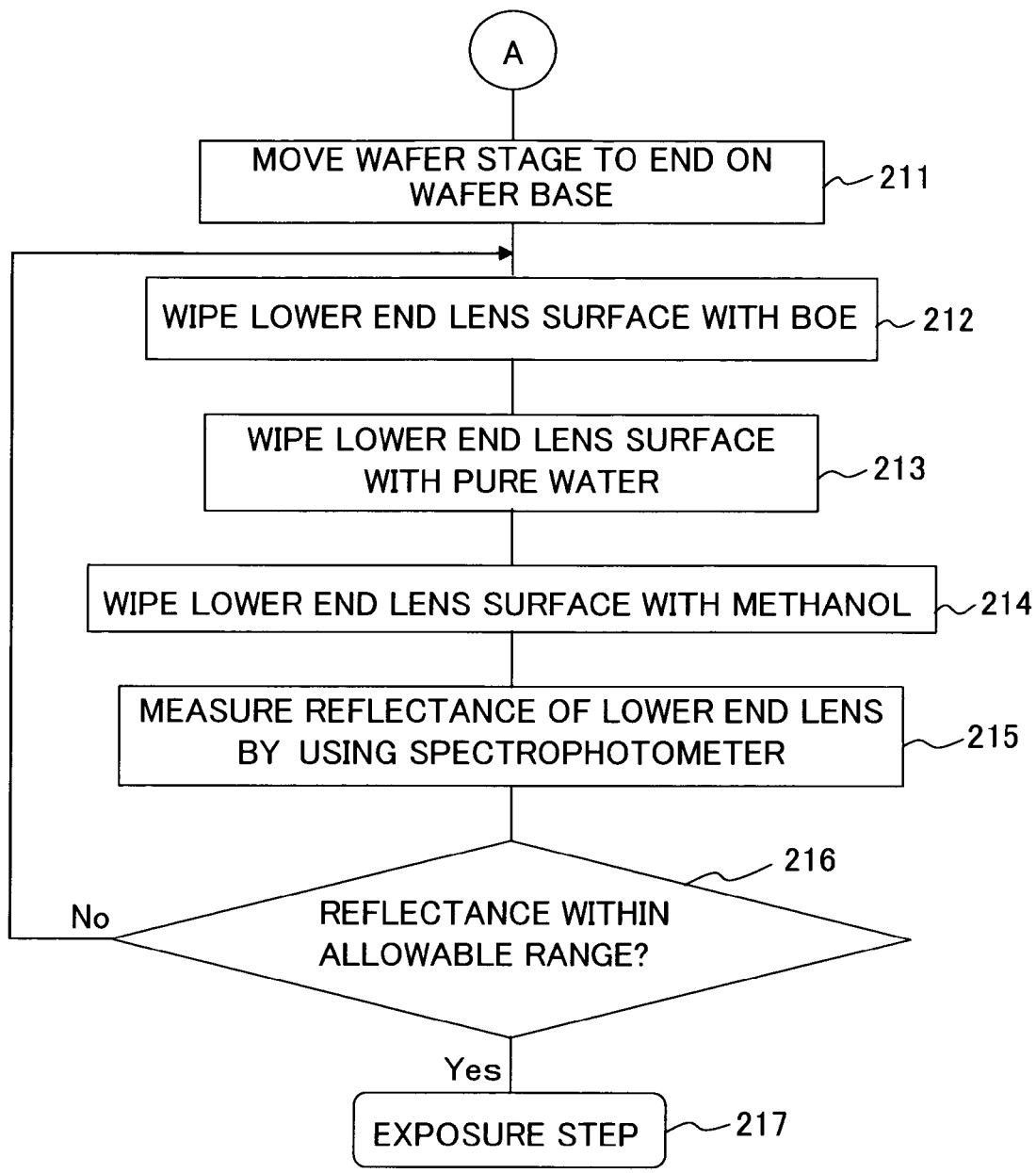

At first, in Step 201 shown in FIG. 7 (FIGS. 7A and 7B), the amount of the flare of the projection optical system shown in FIG. 5 is measured. For this purpose, a reticle R2 for evaluating the flare shown in FIG. 6A is loaded in place of the reticle R on the reticle stage 22 shown in FIG. 5. For example, a plurality of light-shielding patterns C1 each having several mm square are formed at a central portion in the non-scanning direction (X direction) with the background of a light-transmitting section T in an area of the reticle R2 corresponding to the illumination area 21R. A plurality of light-shielding patterns C2, C3 each having several mm square are also formed at circumferential portions. A plurality of light-shielding patterns each having several mm square are formed at circumferential portions in the scanning direction (Y direction) in the area of the reticle R2 corresponding to the illumination area 21R.

A wafer (also referred to as "wafer W"), to which an unexposed positive type photoresist is applied, is loaded on the wafer stage 28 shown in FIG. 5, and a large number of shot areas on the wafer W are subjected to the scanning exposure with the pattern image of the reticle R2 shown in FIG. 6A while gradually changing the exposure amount. After that, the wafer is developed, and concave/convex patterns, which are formed in the respective shot areas of the wafer W, are measured by using, for example, an unillustrated pattern-measuring apparatus. The concave/convex patterns can be also measured by using, for example, the alignment sensor shown in FIG. 5.

When the pattern-measuring apparatus is provided separately from the exposure apparatus, then the pattern-measuring apparatus may be provided for the coater-developer, or the pattern-measuring apparatus may be in line-connected to the coater-developer. The measurement result may be fed to the exposure apparatus, for example, via a communication line.

Figure 6B:
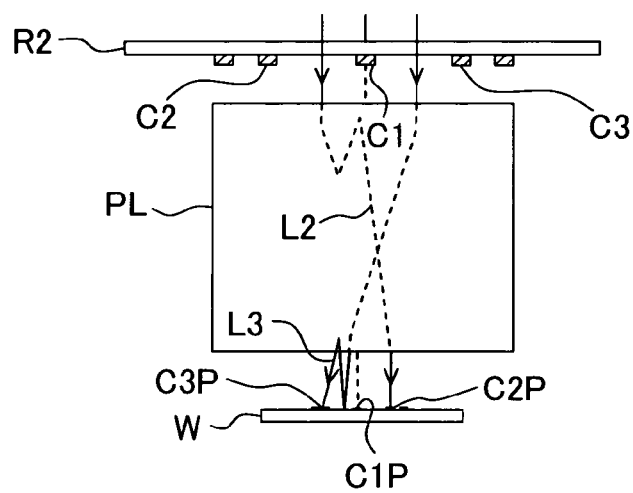

In this procedure, as shown in an illustrative view of FIG. 6B, if the flare is absent, the respective areas of the images C1P, C2P, C3P on the wafer W, which correspond to the light-shielding patterns C1, C2, C3, must remain as convex portions, because they are not exposed. However, for example, if the reflectances of the outer surfaces of the upper end and lower end lenses are increased in the projection optical system PL to cause the flare light beams L2, L3, the exposure light beam is also radiated onto the positions of the images C2P, C3P of the light-shielding patterns C2, C3. Therefore, when the exposure amount is increased, the concave portions are also formed after the development at the positions of the images C2P, C3P.

Figure 6C:
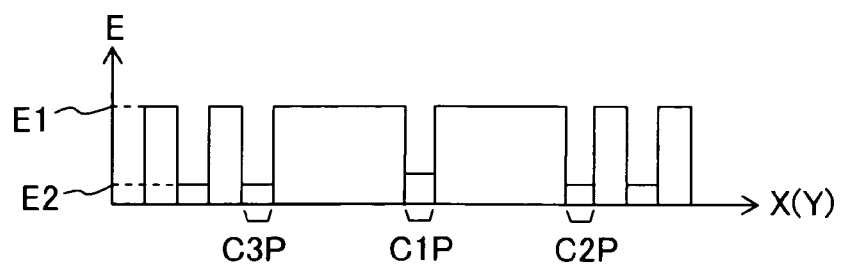

FIG. 6C shows an example of the evaluation result of the flare amount depending on the position of each of the shot areas in the X direction (or in the Y direction) obtained by the measurement of the concave/convex pattern of each of the shot areas on the wafer W after the development. In FIG. 6C, the vertical axis represents the exposure amount E obtained when the concave pattern is firstly formed after the development at each of the positions X (or Y). Therefore, the exposure amount E1 represents the exposure amount obtained when the area corresponding to the light-transmitting section T shown in FIG. 6A is formed as the concave portion after the development. On the other hand, the exposure amount E2 corresponding to the circumferential image C3P represents the value determined as follows. That is, assuming that the exposure amount, which is obtained when the concave portion is formed at the position of the circumferential image C3P after the development, is E23, the exposure amount E2 at the position of the image C3P when the exposure amount is E1 can be represented as follows.

$$E2 = E1 \times (E1/E23) \quad (1)$$

Therefore, the ratio of the flare light beam at the position of the image C3P is E2/E1×100 (%). Similarly, it is also possible to determine the ratio of the flare light beam at the position of the central image C1P and the ratio of the flare light beam at the position of, for example, another circumferential image C2P. Details of this procedure are disclosed in the pamphlet of International Publication (WO) No. 02/09163 and European Patent Publication EP 1308991 corresponding thereto, contents of which are incorporated herein by reference within a range of permission of the domestic laws and ordinances of the designated state or the selected state designated or selected in this international application.

As disclosed in the pamphlet of International Publication described above, the flare of the illumination optical system 5 can be also evaluated by comparing the light amount obtained when all of patterns are illuminated with the light amount on the wafer stage 28 obtained when only each transmitting pattern is illuminated by using the movable blind 18B shown in FIG. 5 by employing an evaluating reticle having patterns obtained by effecting the black and white reversal for the patterns shown in FIG. 6A.

Subsequently, in Step 202 shown in FIG. 7A, it is judged whether or not the measured flare exceeds an allowable range. If the measured flare is within the allowable range, the routine proceeds to the ordinary exposure step of Step 203. On the other hand, if the flare exceeds the allowable range in Step 202, the routine proceeds to the pollutant removal step in Step 204 and the followings. For this purpose, at first, it is necessary to import the washing solution into the clean room in which the projection exposure apparatus shown in FIG. 5 is accommodated.

Figure 4:
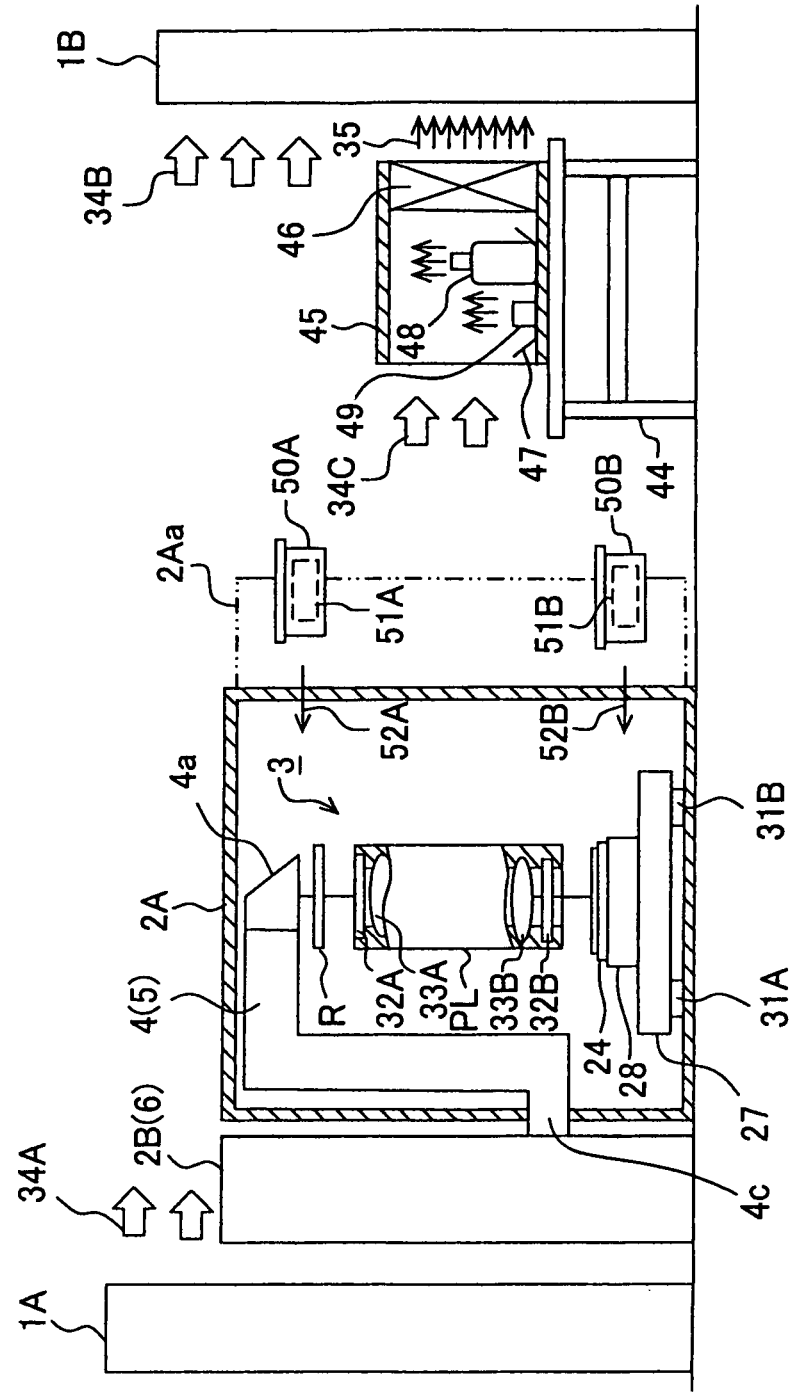
FIG. 4 shows, with partial cutout, an example of arrangement in a clean room in which a projection exposure apparatus according to a second embodiment of the present invention is arranged.

FIG. 4 shows a clean room, for example, in a semiconductor-producing factory installed with the projection exposure apparatus shown in FIG. 5 (depicted as the projection exposure apparatus 3). With reference to FIG. 4, the air, which is cleaned through, for example, a HEPA filter (high efficiency particulate air-filter) and which is temperature-controlled, flows approximately at a constant flow rate as indicated by the arrows 34A, 34B, 34C from a blower 1A disposed at the left end toward an air duct section 1B disposed at the right end. The exposure body main section, which includes those running from the reticle R to the wafer base 27 of the projection exposure apparatus 3 shown in FIG. 5, is installed by the aid of vibration-preventive pedestals 31A, 31B in a box-shaped chamber 2A in the clean room. The sub-chamber 4, which accommodates the illumination optical system 5 (except for the exposure light source 6) shown in FIG. 5, is installed in the vicinity thereof. The end portion 4a (portion in which the mirror 19 and the main condenser lens 20 shown in FIG. 5 are accommodated) of the sub-chamber 4 is constructed detachably. The projection optical system PL is provided with the upper end lens 32A, the lens 33A, . . . , the lens 33B, and the lower end lens 32B as listed in an order starting from the side of the reticle R. The subsidiary chamber 2B, which accommodates the exposure light source 6 shown in FIG. 5, is installed so that the subsidiary chamber 2B adjoins the chamber 2A. The illumination light beam from the exposure light source 6 is guided into the chamber 2A through a channel portion 4c of the sub-channel 4, which is connected to the exposure light source 6. During the exposure, the dust-preventing process is effected in the chamber 2A in a highly sophisticated manner as compared with the interior of the clean room. Further, the chemically clean air (dry air) is supplied to the chamber 2A, in which the temperature and the humidity are controlled in a highly sophisticated manner.

However, when the pollutant removal step is carried out as in this embodiment, then an opening/closing section 2Aa, which is disposed on the downwind side with respect to the chamber 2A, is opened, and a rectangular cylindrical small type draft 45 is installed along the flow of the air on a working desk 44 disposed on the downwind side with respect to the chamber 2A. A chemical filter 46 is installed on the air discharge side of the small type draft 45. Those placed on a tray 47 in the small type draft include a bomb 48 which stores the etching solution containing hydrofluoric acid as the washing solution of the present invention, and a vessel 49 for introducing the etching solution to be used. The bomb 48 and the vessel 49 are made of polypropylene which is strongly resistant to hydrogen fluoride (HF) (or they are made of polyethylene). Those installed in the small type draft 45 also include a bomb which stores pure water and a bomb (not shown) which stores methanol as the organic solvent.

As for the components of the etching solution of this embodiment, an aqueous solution of hydrofluoric acid (HF, 50% by weight) and ammonium fluoride ($NH_4F$, 40% by weight) are mixed at a volume ratio of 1:10, i.e., BOE (buffered oxide etch). The reason, why ammonium fluoride is mixed, is that no harmful influence is exerted, for example, on the magnesium fluoride layer and the lanthanum fluoride layer of the optical thin film and the fluorite as the substrate other than silicon oxide by adjusting pH. As for pH, pH=4 to pH=6 is appropriate, and approximately pH=5 is most appropriate.

With reference to FIG. 4, in this embodiment, the components of BOE (etching solution), which are evaporated from the bomb 48 and the vessel 49 in the small type draft 45, are removed by the chemical filter 46 disposed on the downwind side. Therefore, the components are prevented from being diffused into the clean room.

When BOE is used as the washing solution, then members 51A, 51B such as wiping cloths made of polypropylene, which are soaked with about 1 cc of BOE respectively, are tightly enclosed in containers 50A, 50B made of polypropylene respectively, and they are carried by an operator from the opening/closing section 2Aa into the chamber 2A. In this procedure, the air always flows toward the opening/closing section 2Aa in the clean room. Therefore, even if the components of BOE are slightly evaporated from the members 51A, 51B, then the components pass through the air duct section 1B, and they are removed by the unillustrated filter. Therefore, the components are not diffused into the clean room.

In this state, in Step 204 shown in FIG. 7A, the operator detaches the end portion 4a of the sub-chamber 4 of the illumination optical system in the chamber 2A shown in FIG. 4. After that, the operator detaches the mirror 19 and the main condenser lens 20 shown in FIG. 5. In this process, the reticle stage 22 is positioned at a central portion in the scanning direction, and the reticle is exported therefrom. Subsequently, in Step 205, the surface of the upper end lens 32A of the projection optical system PL is wiped with BOE.

Figure 8:
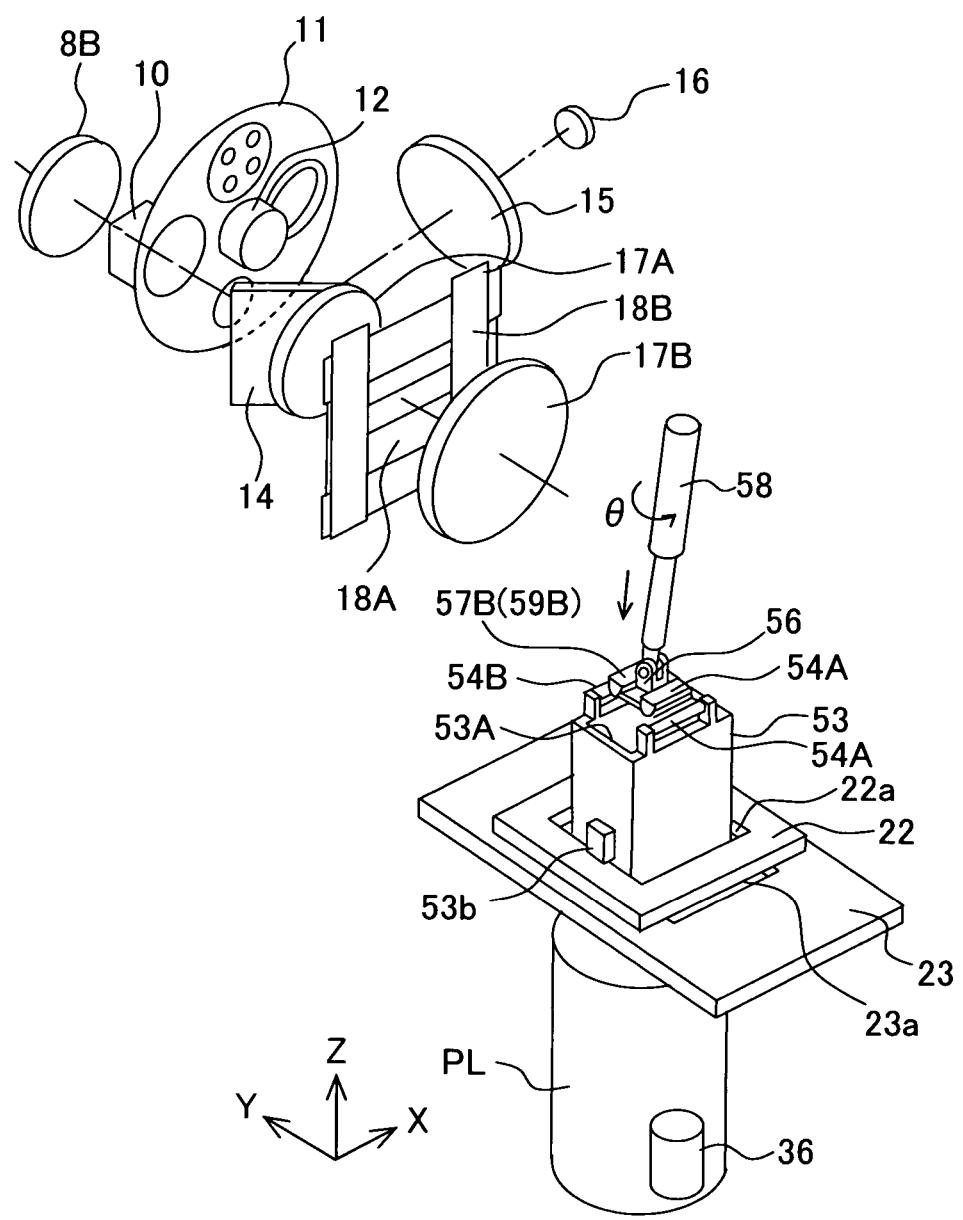
FIG. 8 shows a perspective view illustrating important parts in a state in which a mirror 19 and a main condenser lens 20 are removed from those shown in FIG. 5.
Figure 10:
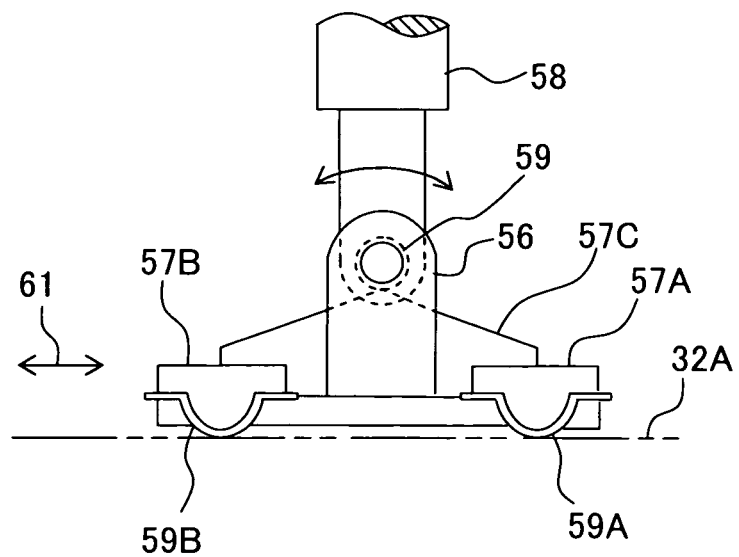
FIG. 10 shows a magnified front view illustrating a support section 56 shown in FIG. 9.

FIG. 8 shows major parts in a state in which the mirror 19 and the main condenser lens 20 are removed from the projection exposure apparatus shown in FIG. 5. With reference to FIG. 8, a cylindrical protecting member 53 (cylindrical member), which has a rectangular frame-shaped cross section that is long in the X direction, is inserted by the operator through the openings 22a, 23a of the reticle stage 22 and the reticle base 23. Carrying handles 54A, 54B are provided at the upper end of the protecting member 53. A stopper 53b, which is used to fix the protecting member 53 on the upper surface of the reticle stage 22, is provided on the side surface of the protecting member 53. Subsequently, the tip section of a cleaning tool 55 for removing the pollutant is inserted into the inner surface 53a of the protecting member 53. The cleaning tool 55 includes a support section 56 (support member) which is rotatably attached to the tip section of a rod-shaped rod section 58 (rod-shaped member), and wiping cloths 59A, 59B (see FIG. 10) which are detachably attached to the bottom surface of the support member 56 by the aid of holding sections 57A, 57B. The first pollutant removal apparatus (cleaning tool) of this embodiment is constructed as including the protecting member 53, the rod section 58, and the support section 56. The projection exposure apparatus of this embodiment is constructed so that the pollutant removal apparatus can be installed thereto. Each of the protecting member 53, the rod section 58, the support section 56, the holding sections 57A, 57B, and the wiping cloths 59A, 59B is made of polypropylene. As shown in FIG. 10 which is a magnified front view of the support section 56, the holding sections 57A, 57B press and fix the wiping cloths 59A, 59B with respect to the support section 56 by the aid of a coil spring 59. The tip sections of the wiping cloths 59A, 59B are soaked with BOE. With reference to FIG. 8 again, the support section 56 is long in the direction of rotation. Therefore, the rod section 58 is rotated in the θ direction so that the support section 56 can pass through the inner surface 53a.

Figure 9:
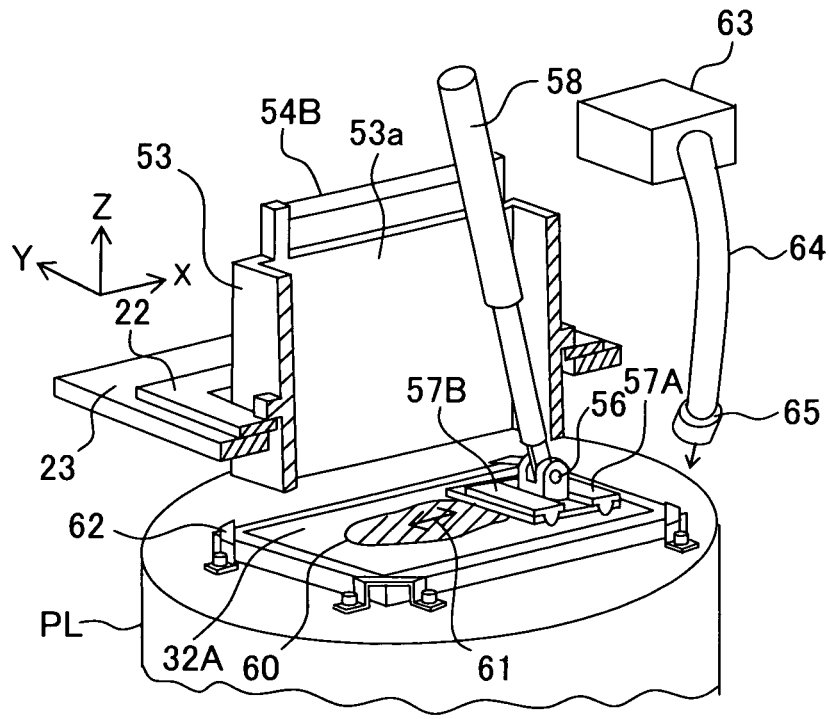
FIG. 9 shows, with partial cutout, a perspective view illustrating important parts when the pollutant is removed from a lens 32A disposed at the upper end of the projection optical system PL.

FIG. 9 shows a sectional view illustrating a state in which the bottom surface of the support section 56 disposed at the tip of the rod section 58 is allowed to make contact with the surface of the upper end lens 32A as the washing objective through the inner surface 53a of the protecting member 53 shown in FIG. 8. With reference to FIG. 9, this embodiment is the scanning exposure type, and the upper end lens 32A is disposed closely to the illumination area 21R of the reticle surface which is long in the X direction (see FIG. 5). Therefore, the area, through which the exposure light beam passes, is an approximately elliptical area 60 which is long in the X direction (non-scanning direction). The silicon oxide film (pollutant) is deposited in the area 60. The upper end lens 32A of this embodiment is the flat plate member having the flat surface of the upper surface for correcting the aberration. The upper end lens 32A is fixed to the upper end of the projection optical system PL by the aid of fixing fixtures 62. The width of the support section 56 is designed to be slightly wider than the width of the area 60 in the Y direction. The width of each of the wiping cloths 59A, 59B protruding on the bottom surface of the support section 56 is also designed to be wider than the width of the area 60 in the Y direction. The rod section 58 is reciprocated by the operator in the X direction to wipe the area 60 on the upper end lens 32A with the wiping cloths 59A, 59B disposed on the bottom surface of the support section 56 so that the area 60 is covered therewith, while the wiping cloths 59A, 59B are allowed to make round trips three times in the non-scanning direction as indicated by the arrow 61.

During this process, the period of time, in which the wiping cloths 59A, 59B make contact with respective portions of the area 60, is approximately about 10 seconds. The etching rate of BOE with respect to silicon oxide is about 70 nm/min at 25° C. Therefore, the period of time, which is required to remove the silicon oxide of 10 nm, is sufficiently 10 seconds. The etching rate herein refers to the amount (depth) of dissolution of silicon oxide per 1 minute. When the silicon oxide film is thick, it is enough that the contact time is prolonged.

Subsequently, in Step 206, the wiping cloths 59A, 59B of the support section 56 are exchanged with wiping cloths soaked with pure water. The wiping cloths are allowed to make round trips three times on the area 60 on the upper end lens 32A in the same manner as in FIG. 9 to remove BOE. Subsequently, in Step 207, the wiping cloths of the support section 56 are exchanged with wiping cloths soaked with ethanol (organic solvent). The wiping cloths are allowed to make round trips three times on the area 60 on the upper end lens 32A in the same manner as in FIG. 9 to completely remove BOE. Accordingly, BOE is washed out from the surface of the upper end lens 32A so that any remaining component does not harmfully affect the optical thin film and the substrate.

Subsequently, in Step 208, the reflection characteristic of the surface of the upper end lens 32A is measured by using a spectrophotometer 63 shown in FIG. 9 in order to judge whether or not the pollutant has been removed until arrival at an allowable range. In this embodiment, the spectrophotometer 63 is used, which is provided with an optical fiber bundle 64 and a light-emitting/receiving section 65. Accordingly, it is possible to measure, in situ, the reflectance characteristic of the upper end lens 32A in a state that the upper end lens 32A is incorporated into the projection optical system PL. It is possible to judge the degree of removal of the pollutant by comparing spectroscopic characteristic profiles before and after the pollutant removal process.

The fiber spectrophotometer roughly includes three portions. That is, there are included the optical fiber bundle 64 and the spectroscopic light amount detector (detector) and the light source in the spectrophotometer 63. Upon the construction, those having appropriately corresponding performance are selected depending on the desired measuring wavelength for the directed detection objective surface. For example, when the ultraviolet region is directed as in this embodiment, the fiber spectrophotometer includes a light source which emits the ultraviolet light beam, a spectroscopic light amount detector which is capable of detecting the ultraviolet light beam, and an optical fiber which is capable of transmitting the ultraviolet light beam.

As for the light source, it is desirable to use those of the compact type which are transportable in order to use the fiber spectrophotometer for the projection exposure apparatus and which provide large outputs in order to increase the S/N ratio. As for the spectroscopic light amount detector, it is desirable to use detectors which are not based on the scanning system but which are based on the photodiode array system. In this case, it is most advantageous that the spectroscopic profile can be conveniently obtained in a wide zone instantaneously as compared with the scanning system. The photodiode array system does not include any rotary mechanism based on the use of the grating. The white light is radiated onto the objective detection surface. The light amount, which is reflected or transmitted thereby, is spectroscopically measured by using the fixed grating. The photodiode array can be used to simultaneously detect the spectroscopic profiles in a wide zone.

The use of the optical fiber is advantageous in that any precise positional adjustment or the like is not required for the optical system running from the light source to the objective detection surface or from the objective detection surface to the spectrophotometer, any influence is hardly exerted by the surrounding environment, and the optical system can be freely moved. When the optical fiber can be moved to freely measure the spectroscopic profile at a desired measuring position, the measurement can be performed with ease without moving (taking out) optical parts incorporated into the apparatus.

When the optical performance of the antireflection film or the like is confirmed, it is extremely important to confirm the reflection spectroscopic profile thereof. Therefore, it is desirable to confirm the reflection spectroscopic profile by using the fiber spectrophotometer in order to confirm whether or not the pollutant has been successfully wiped and removed, or to what extent the pollutant has been successfully removed. When the reflection spectroscopic profile is measured by using the fiber spectrophotometer, the optical fiber bundle 64 is used, which is bundled while mixing a light-introducing fiber directed from the light source to the objective detection surface and a light-receiving fiber directed from the objective detection surface to the spectrophotometer. When the bundle is formed in parallel, one bundle is provided, wherein the light-introducing fiber and the light-receiving fiber can be moved while retaining the same arrangement until arrival at the objective detection surface.

The separating distance is provided by several mm in the vertical direction from the end surface of the fiber measuring element to the objective detection surface by using the optical fiber having a diameter of several tens μm and a numerical aperture NA of about 0.1. On this condition, the light beam, which comes from the light-introducing fiber in the optical fiber bundle 64, is reflected by the objective detection surface. The light beam comes into the light-receiving fiber, making it possible to detect the reflection spectroscopic profile by using the spectroscopic light amount detector. When the optical fiber bundle 64 is used, it is important to perform the measurement while retaining the optical fiber bundle 64 perpendicularly to the objective detection surface in order to perform the measurement stably. For this purpose, it is preferable to use a bundled optical fiber having the triple structure, or a bundled optical fiber including not less than several tens of fibers arranged randomly. The bundled fiber having the triple structure includes a central portion which is a light-receiving fiber for detecting the light beam reflected from the objective detection surface, an intermediate portion which is a light-introducing fiber for allowing the light beam to come into the objective detection surface, and an outermost portion which is an inclination-adjusting fiber for detecting the inclination of the bundled fiber. When the inclination of the bundled fiber is corrected so that the amount of detected light is identical in the inclination-adjusting fiber, the measurement can be performed under the same condition provided that the height of the end surface of the fiber measuring element from the objective detection surface is constant.

The bundled optical fiber including not less than several tens of fibers arranged randomly is obtained by equivalently arranging and bundling light-receiving fibers and light-introducing fibers. Accordingly, the light amount is averaged to effect the incidence and the reflection. It is possible to mitigate the sensitivity with respect to the inclination of the bundled fiber, and it is possible to detect the reflection spectroscopic profile.

As described above, when the fiber spectrophotometer is used, it is possible to measure the reflection spectroscopic profile completely freely. The reflection spectroscopic profile can be measured manually at arbitrary positions. Therefore, it is possible to recognize a situation of pollutant removal at a desired position. When the projection exposure apparatus is provided with a mechanism which automatically moves the measuring element of the bundled fiber to the objective detection surface of the fiber spectrophotometer and which maintains a constant height from the objective detection surface, it is possible to recognize the adhesion state of the pollutant in a time-dependent manner before applying the pollutant removal procedure. It is possible to confirm the degree of removal before and after applying the pollutant removal method. When a mapping mechanism is adopted, it is possible to two-dimensionally detect the adhesion state of the pollutant in the objective detection surface and the degree of removal before and after the pollutant removal procedure. In particular, in the pollutant removal procedure, it is possible to specify any portion on which the pollutant remains without being wiped.

The curve C shown in FIG. 1 shows an example of the result of the measurement of the reflection characteristic by using the spectrophotometer 63 in Step 208. The reflectance at the wavelength (193 nm) of the ArF excimer laser of the curve C is returned to the original satisfactory reflection characteristic (curve A) of the value of 0.1%. Further, the reflection characteristic in the wavelength region of 180 nm to 250 nm is completely returned to the original satisfactory reflection characteristic. Accordingly, it is appreciated that only the silicon oxide pollution has been successfully removed without harmfully affecting the optical thin film and the optical member.

Subsequently, in Step 209, if the reflectance at the exposure wavelength of the upper end lens 32A measured by using the spectrophotometer 63 exceeds the allowable range even partially, the routine returns to Step 205 to repeat the steps of the washing with BOE and the removal of BOE. In Step 209, if the reflectance at the exposure wavelength of the upper end lens 32A measured by using the spectrophotometer 63 is included in the allowable range over the entire surface, the operation proceeds to Step 210. The operator takes out the cleaning tool 55 and the protecting member 53 shown in FIG. 8. The mirror 19 and the main condenser lens 20 shown in FIG. 5 are attached to the illumination optical system 5 to adjust the optical axis and the like. The illumination optical system 10 can be adjusted in a short period of time as compared with the projection optical system PL.

Subsequently, in Step 211, the wafer stage 28 shown in FIG. 5 is moved to the end in the −X direction. Accordingly, it is possible to wipe the surface of the lower end lens 32B of the projection optical system PL. Subsequently, in Step 212, the surface of the lower end lens 32B is wiped with BOE described above.

Figure 11:
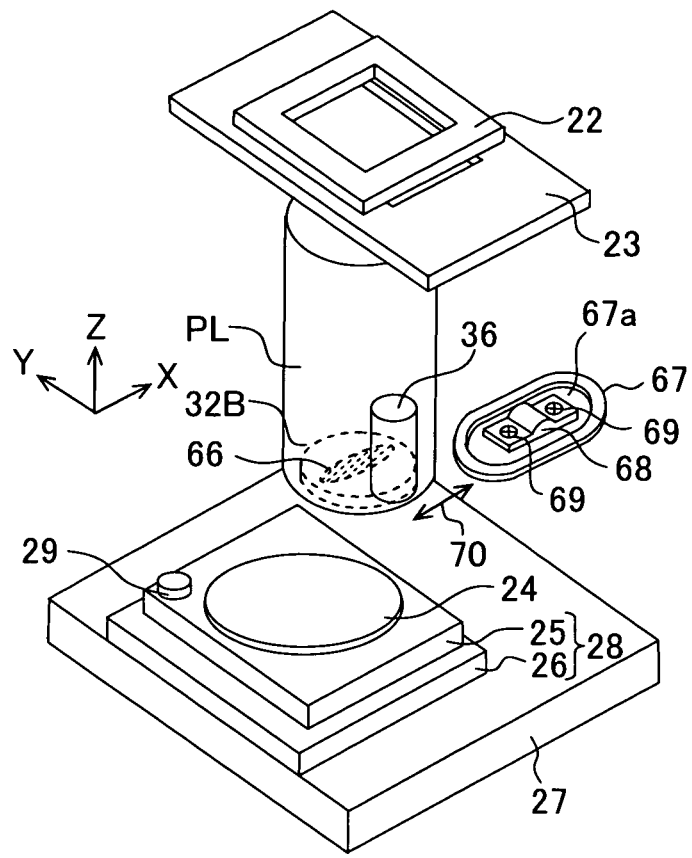
FIG. 11 shows a perspective view illustrating important parts when the pollutant is removed from a lens 32B disposed at the lower end of the projection optical system PL.

FIG. 11 shows major parts disposed at the lower portion of the projection optical system PL shown in FIG. 5. With reference to FIG. 11, an elliptical flat plate-shaped movable member 67 (support member), which is long in the X direction (non-scanning direction), is moved by the operator toward the bottom surface of the projection optical system PL. A wiping cloth 68 made of polypropylene, which is soaked with BOE, is detachably attached to a recess 67a on the upper surface of the movable member 67 made of polypropylene by the aid of holding screws 69 made of polycarbonate. A second pollutant removal apparatus (cleaning tool) of this embodiment is constructed as including the movable member 67 and the wiping cloth 68. With reference to FIG. 11, this embodiment is the scanning exposure type. The lower end lens 32B is disposed closely to the exposure area 21W (see FIG. 5) on the wafer surface which is long in the X direction. Therefore, the exposure light beam passes through an approximately elliptical area 66 which is long in the X direction (non-scanning direction). The silicon oxide film (pollutant) is deposited in the area 66. The lower end lens 32B of this embodiment is a flat plate member for correcting the aberration with the lower surface (washing surface) which is a flat surface. The width of the movable member 67 is designed to be sufficiently wider than the width of the area 66 in the Y direction. The width in the Y direction of the wiping cloth 68 (see FIG. 12) protruding on the movable member 67 is also designed to be wider than the width of the area 66 in the Y direction.

Figure 12:
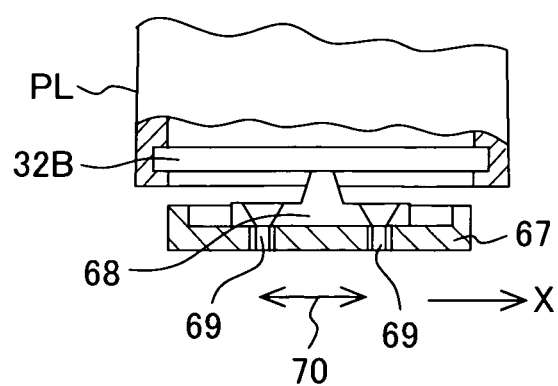
FIG. 12 shows a sectional view illustrating a state in which a wiping cloth 68 of a movable member 67 is allowed to make contact with the lower end lens 32B.

As shown in FIG. 12 which is a sectional view illustrating the lower end portion of the projection optical system PL shown in FIG. 11, the operator allows the wiping cloth 68 on the movable member 67 to make contact with the surface of the lower end lens 32B to wipe the area 66 on the lower end lens 32B with the wiping cloth 68 so that the area 66 is covered therewith, while the movable member 67 is allowed to make round trips three times in the non-scanning direction indicated by the arrow 70. During this process, the period of time, in which the wiping cloth 68 makes contact with respective portions of the area 66, is approximately about 10 seconds. Accordingly, the silicon oxide of about 10 nm is removed approximately completely. When the silicon oxide film is thick, it is enough that the contact time is prolonged.

Subsequently, in Step 213, the wiping cloth 68 of the movable member 67 is exchanged with a wiping cloth soaked with pure water. The wiping cloth is allowed to make round trips three times on the area 66 of the lower end lens 32B in the same manner as in FIG. 11 to remove BOE. Subsequently, in Step 214, the wiping cloth of the movable member 67 is exchanged with a wiping cloth soaked with ethanol (organic solvent). The wiping cloth is allowed to make round trips three times on the area 66 of the lower end lens 32B in the same manner as in FIG. 11 to completely remove BOE. Accordingly, BOE is washed out from the surface of the lower end lens 32B so that any remaining component does not harmfully affect the optical thin film and the substrate.

Subsequently, in Step 215, the reflection characteristic of the surface of the lower end lens 32B is measured by using the spectrophotometer 63 shown in FIG. 9 in order to judge whether or not the pollutant has been removed until arrival at an allowable range in the same manner as in Step 208. Subsequently, in Step 216, if the reflectance at the exposure wavelength of the lower end lens 32B measured by using the spectrophotometer 63 exceeds the allowable range even partially, the routine returns to Step 212 to repeat the steps of the washing with BOE and the removal of BOE. In Step 216, if the reflectance at the exposure wavelength of the lower end lens 32B measured by using the spectrophotometer 63 is included in the allowable range over the entire surface, then the operation proceeds to Step 217, and the ordinary exposure step is executed.

As described above, according to this embodiment, when the pollutants adhere to the upper end lens 32A and the lower end lens 32B of the projection optical system PL, the pollutants can be quickly removed without detaching the lenses 32A, 32B from the projection optical system PL. Therefore, the cost to exchange the optical member is not generated. Further, the period of time, in which the exposure apparatus cannot be used, is scarcely generated by the exchange and the adjustment for the optical member. Therefore, an advantage is obtained such that the throughput of the exposure step is scarcely lowered.

When the pollutant adheres to the surface of the main condenser lens 20 as the optical member disposed at the end of the illumination optical system 5 on the side of the reticle as shown in FIG. 5, the pollutant can be also removed quickly by using a cleaning tool equivalent to the movable member 67 shown in FIG. 11, without detaching the main condenser lens 20.

In this embodiment, the mixing ratio of the hydrofluoric acid and ammonium fluoride is 1:10 for the washing solution. However, the effect does not greatly differ even when the mixing ratio is changed. It is also allowable to use those obtained by further diluting hydrogen fluoride with water. When it is known that the pollutant is composed of only silicon oxide as described above, it is possible to exhibit the sufficient washing effect with the mixed solution of hydrofluoric acid and ammonium fluoride.

Next, an explanation will be made, as another example of the second embodiment of the present invention, about a case in which the pollutant is the dirt which contains organic matters such as hydrocarbon and inorganic matters such as ammonium sulfate. In this case, an etching solution (BOE/IPA) is prepared as the washing solution by mixing, at a ratio of 1:1, BOE obtained by mixing an aqueous solution of hydrofluoric acid (HF, 50% by weight) and ammonium fluoride ($NH_4F$, 40% by weight) at a volume ratio of 1:10 and isopropyl alcohol. The reason is as follows. That is, hydrocarbon is dissolved in isopropyl alcohol, ammonium sulfate is dissolved in water, and silicon oxide is dissolved in hydrofluoric acid. Therefore, when BOE/IPA is used as the etching solution, it is possible to quickly remove various pollutants.

BOE/IPA was used to remove the dirt actually generated in a relay unit (optical system) which provides the excimer laser light beam from the laser light source to the projection optical system in the projection exposure apparatus based on the use of the KrF excimer laser. An obtained result is shown in FIG. 2.

FIG. 2 shows the wavelength and the transmittance of the optical member. The curve D shown in FIG. 2 represents the transmittance of an optical member having an antireflection film ($MgF_2/NdF_3/MgF_2$) applied onto a quartz substrate, the curve E represents the transmittance of a member obtained by adhering the dirt on the optical member, and the curve F represents the transmittance of a member obtained after treating the dirt of the member by the pollutant removal method of the present invention. Specifically, the dirt is a mixed deposit having a thickness of 5 nm deposited with organic dirt and silicon oxide by the laser beam. As shown in FIG. 2, the following transmittances are obtained at the wavelength (248 nm) of the KrF excimer laser. That is, the transmittance is 100% in the case of the member having no dirt (curve D), the transmittance is 72% in the case of the member having the dirt (curve E), and the transmittance is 99% in the case of the member from which the dirt has been removed (curve F). It is postulated that the cause of the dirt is the mixture of hydrocarbon and silicon oxide. The curve F represents the transmittance obtained after the optical member was immersed for 60 seconds in a beaker filled with BOE/IPA to dissolve the pollutant, and then BOE/IPA was washed out with pure water and methanol.

As appreciated from FIG. 2, the transmittance at the wavelength of 248 nm after the removal was restored to not less than 99%, and the spectroscopic characteristic was restored to the original characteristic as well. Further, as shown in FIG. 2, the transmittance in a wavelength region of 190 nm to 400 nm was completely restored to the original satisfactory transmittance characteristic. Accordingly, it is understood that only the pollutant was successfully removed without exerting any harmful influence on the optical thin film and the substrate. In this embodiment, the mixing ratio of BOE and isopropyl alcohol is 1:1. However, the mixing ratio is not limited thereto.

In the embodiment described above, the reticle stage 22 is positioned at the approximately central portion in the scanning direction in Step 204, and the centers are approximately coincident with each other for the opening 22a of the reticle stage 22 and the opening 23a of the reticle base 23, before removing the pollutant adhered to the upper end lens 32A of the projection optical system PL. However, at least the reticle stage 22, which is included in the reticle stage system as described above, may be detached and removed from the reticle base 23 in the same manner as the mirror 19 and the main condenser lens 20 of the illumination optical system 5.

In the embodiment described above, the pollutant is removed for both of the upper and lower end lenses 32A, 32B of the projection optical system PL. However, the pollutant may be removed from only one of the upper and lower end lenses 32A, 32B. Further, the pollutant may be removed by using a cleaning tool similar or equivalent to the movable member 67 shown in FIG. 11 from only the optical member (main condenser lens 20 in this embodiment) provided at the end of the illumination optical system 5 on the side of the reticle without removing the pollutant from the upper and lower end lenses 32A, 32B. In other words, the pollutant may be removed from at least one of the optical member disposed at the end of the illumination optical system 5 on the side of the reticle and the optical members disposed at the both ends of the projection optical system PL.

In the embodiment described above, the mirror 19 and the main condenser lens 20 of the illumination optical system 5 are detached in Step 204 in order to remove the pollutant from the upper end lens 32A of the projection optical system PL. However, it is enough that only the main condenser lens 20, i.e., only the optical member disposed at the end of the illumination optical system 5 on the side of the lens is detached. In FIG. 5, the main condenser lens 20 is depicted as one optical member (lens element). However, the main condenser lens 20 is actually composed of a plurality of optical members. Therefore, it is also enough that at least one of the optical members is merely detached. Alternatively, the following arrangement or procedure may be also adopted. That is, at least a part (for example, the end portion 4a shown in FIG. 4) of the illumination optical system 5 including the main condenser lens 20 (at least one optical member) may be constructed to be movable, for example, with a slide mechanism. When the surface of at least one of the optical member (lens 32A) provided at the upper end of the projection optical system PL and the optical member provided at the end of the illumination optical system 5 on the side of the reticle is wiped, for example, with BOE as described above, at least a part of the illumination optical system 5 is moved to secure the space for the cleaning operation. Further, in the embodiment described above, the optical member, which is disposed at the end of the illumination optical system 5 on the side of the reticle, is the main condenser lens 20. However, for example, the following arrangement or procedure may be also adopted. That is, a plane parallel plate (cover glass plate) is provided at the end of the illumination optical system 5 on the side of the reticle only the plane parallel plate or the plane parallel plate and another optical member (for example, the main condenser lens 20) is detached as an integrated body.

In the embodiment described above, a part of those including at least the optical member of the illumination optical system 5 disposed at the end on the side of the reticle may be detached and replaced with another member rather than removing the pollutant from the optical member of the illumination optical system 5 disposed at the end on the side of the reticle by using the cleaning tool as described above. Alternatively, a part of the illumination optical system 5 may be detached, the pollutant may be removed from the optical member disposed at the end on the side of the reticle by using the etching solution described above, and the part of the illumination optical system 5 may be returned and reinstalled to the projection exposure apparatus 3, for the following reason. That is, the illumination optical system 5 is adjusted easily after the exchange or the detachment and the attachment as compared with the projection optical system PL. In this procedure, the pollutant may be removed from at least one of the optical members disposed at the both ends of the projection optical system PL by using the movable member 67 shown in FIG. 11, in addition to the exchange or the detachment and the attachment of the part of the illumination optical system 5. The optical member disposed at the end of the illumination optical system 5 on the side of the reticle, for which the exchange or the detachment and the attachment are performed, is not limited to the main condenser lens 20. For example, it is also allowable that a plane parallel plate (cover glass plate) may be exchanged or detached and attached.

In the embodiment described above, the optical member, which is provided at each of the both ends of the projection optical system PL, is the aberration-correcting plate. However, at least one of the optical members disposed at the both ends may be another member, for example, a lens or a plane parallel plate (cover glass plate).

In the embodiment described above, the transmittance of the optical system including those running from the beam splitter 14 to the wafer stage 28 as shown in FIG. 5 or the flare generated in at least one of the illumination optical system 5 and the projection optical system PL is monitored (measured) to judge whether or not the pollutant is required to be removed on the basis of the result of the measurement (or to judge, for example, the timing for carrying out the removal). If the transmittance or the flare exceeds the allowable range, the pollutant is removed. However, the present invention is not limited thereto. The pollutant may be removed in the same manner as described above by monitoring another optical characteristic other than the transmittance and the flare (for example, the illuminance or the illuminance distribution on the reticle R or the wafer W, the image formation characteristic such as the aberration, or the reflectance of the surface (cleaning surface) of the optical member as the object of the removal of the pollutant). Further, the following procedure is also available. That is, if it is judged that the optical characteristic such as the flare as described above does not exceed the allowable range on the basis of the result of the measurement, the executing point of time (timing), at which the pollutant is to be removed, is postulated (determined) from the result of the measurement. After the projection exposure apparatus 3 is operated for a predetermined period of time after the measurement, the pollutant is immediately removed without measuring the optical characteristic. Alternatively, the pollutant may be removed in exactly the same manner as the embodiment described above, for example, every certain period of time or every predetermined operation time of the projection exposure apparatus 3 without monitoring the optical characteristic (for example, the transmittance and the flare) of the optical system including at least a part of the illumination optical system 5 and the projection optical system PL.

In the embodiment described above, the pollutant is removed by using only one type of the solvent (BOE or BOE/IPA as the etching solution described above). However, it is also allowable to use a plurality of types of solvents (including pure water). In this procedure, every time when the pollutant is removed from the optical member with one solvent, the optical characteristic (for example, the reflectance) of the optical member (or the optical system into which the optical member is incorporated) may be measured. When the type of the pollutant adhered to the optical member is unknown, the following procedure may be adopted. That is, the pollutant is removed with a plurality of types of solvents respectively. The optical characteristic of the optical member (or the optical system into which the optical member is incorporated) is measured every time when the removal operation is performed. Accordingly, the type of the pollutant is specified, i.e., at least one solvent most suitable for the removal operation is determined. Further, when the pollutant is removed for a plurality of optical members respectively, it is also allowable that the type of the solvent (or combination of the solvents) to be used to remove the pollutant may differ for every optical member or between a part or parts of the plurality of optical members and another optical member.

In the embodiment described above, the optical characteristic (for example, the reflectance) of the optical member is measured after the removal operation in order to confirm whether or not the pollutant is completely removed (i.e., whether or not the remaining pollutant is not more than the allowable value). However, it is not necessarily indispensable to perform the measurement of the optical characteristic. Alternatively, the measurement of the optical characteristic may be performed only after the first time (or a plurality of times from the first time) removal operation to confirm the result of the removal of the pollutant. The measurement of the optical characteristic may not be performed thereafter. Further, the number of optical characteristic or characteristics of the optical member to be measured after the operation for removing the pollutant is not limited to one (for example, the reflectance). A plurality of optical characteristics may be measured. The type of the optical characteristic (or combination of the optical characteristics) to be measured after the removal operation may differ depending on the position of the optical member from which the pollutant is removed (in other words between a plurality of optical members). Alternatively, the optical performance (for example, the resolving power, the illuminance uniformity, and the CD-focus) of the projection exposure apparatus may be measured before and after the removal operation for the pollutant respectively to verify the effect to improve the optical performance by the removal operation. In this procedure, the following operation is preferably adopted. That is, the image formation characteristic (for example, the aberration) of the projection optical system PL is also measured especially after the removal operation. If the image formation characteristic is deviated from a predetermined allowable range, the image formation characteristic can be adjusted, for example, by moving the optical element of the projection optical system PL.

In the embodiment described above, the reflectance of the optical member is measured as the information about the pollutant remaining on the optical member in order to judge whether or not the removal is required again after the removal of the pollutant (i.e., in order to confirm the removal situation). However, the measuring apparatus is not limited to the spectrophotometer, and the information is not limited to the reflectance as well. It is not necessarily indispensable that the information is gathered (reflectance or the like is measured) after the removal of the pollutant.

In the embodiment described above, the pollutant is removed as described above while temporarily stopping the operation during the operation of the projection exposure apparatus 3 installed in the clean room in the device-producing factory. However, the present invention is not limited thereto. The pollutant may be removed in exactly the same manner as the embodiment described above, for example, during the maintenance for the projection exposure apparatus 3.

In the embodiment described above, the cleaning tool described above (FIGS. 9 and 11) is moved by the operator. However, the following procedure is also available. That is, the cleaning tool is held, for example, by a tip section of a robot hand, and the cleaning tool is operated by a driving mechanism provided with, for example, a driving motor or an air cylinder.

In the embodiment described above, the pollutant is removed from the upper and lower end lenses 32A, 32B by using the cleaning tool described above (FIGS. 9 and 11) in the state in which the projection optical system PL is installed to the projection exposure apparatus 3. However, for example, if the optical characteristic is not within the allowable range even when the removal operation is performed, it is preferable that a part of the projection optical system PL, which includes the optical member from which the pollutant is to be removed from the surface, is exchanged for the entire projection optical, system PL or at least one end of the projection optical system PL. When the exchange is performed in combination with the removal of the pollutant as described above, it is possible to decrease the number of times, required during the operation period of the projection exposure apparatus 3, for exchanging the entire projection optical system PL or a part of the projection optical system PL including the optical member disposed at least at one end thereof. It is possible to improve the working rate of the projection exposure apparatus 3. In this procedure, the removal of the pollutant as described above is performed at least once (ordinary twice) after the exchange, and then the exchange is performed again. When the exchange is performed, the following procedure is preferably performed after the completion of the exchange. That is, for example, the projected image of the pin hole of the lens is detected by using a photoelectric sensor installed for the wafer stage 28. Alternatively, for example, a test exposure process is performed. Accordingly, the wavefront aberration of the projection optical system PL is measured. It is desired that the optical characteristic (image formation characteristic) is adjusted, for example, by moving at least one lens of the projection optical system PL on the basis of the measured wavefront aberration and the Zernike polynomial.

In the embodiment described above, the optical member, from which the pollutant is to be removed as described above, is made of quartz (synthetic quartz). However, there is no limitation thereto. For example, it is also allowable to use synthetic quartz doped with impurity such as fluorine, or fluorite or other optical glasses. Not only the optical member from which the pollutant is to be removed as described above but also other optical members to be incorporated into the illumination optical system 5 and the projection optical system PL respectively are not limited to synthetic quartz. It is also allowable to use other saltpeter materials (for example, fluorite as described above). In the embodiment shown in FIG. 11, the organic solvent is isopropyl alcohol. However, there is no limitation thereto. It is also allowable to use methanol, ethanol, propanol, butanol, and acetone.

The antireflection film may be constructed as the film of at least one of magnesium fluoride, calcium fluoride, aluminum fluoride, cryolite, thiolyte, neodymium fluoride, lanthanum fluoride, gadolinium fluoride, yttrium fluoride, silicon oxide, aluminum oxide, hafnium oxide, titanium oxide, and zirconium oxide. However, it is desirable that the outermost surface (thin film) of the optical member is composed of fluoride which is hardly affected by (hardly dissolved in) the etching solution (for example, BOE and BOE/IPA) containing hydrofluoric acid.

In the embodiment described above, the optical system, which includes the optical member from which the pollutant adhered to the surface is to be removed, includes at least the projection optical system PL. However, the present invention is also applicable when the optical system includes only the illumination optical system. The respective arrangements of the illumination optical system 5 and the projection optical system PL are not limited to those described in the foregoing embodiment, which may be arbitrarily constructed. For example, the projection optical system PL may be any one of the refraction system, the cata-dioptric system, and the reflection system. Further, the projection optical system PL may be any one of the reduction system, the 1× magnification system, and the magnification system. The optical integrator 10 of the illumination optical system 5 is not limited to the fly's eye lens, which may be, for example, an inner surface reflection type integrator (for example, a rod integrator). A shaping optical system, which includes a plurality of diffraction optical elements to be arranged exchangeably in the illumination optical system, a pair of prisms (for example, conical prisms or polyhedral prisms) with a variable spacing distance in relation to the axial direction of the illumination optical system, and a zoom lens (afocal system), may be used in order that the optical system is arranged between the light source 6 and the optical integrator 10 in place of the aperture diaphragm member 11 or in combination with the aperture diaphragm member 11 to change the intensity distribution of the illumination light beam IL, for example, on the pupil plane of the illumination optical system 5.

The projection exposure apparatus of the embodiment described above can be produced such that the illumination optical system and the projection optical system, which are composed of a plurality of lenses, are incorporated into the main body of the exposure apparatus to perform the optical adjustment, the reticle stage and the wafer stage, which are composed of a large number of mechanical parts, are attached to the main body of the exposure apparatus to connect wirings and pipings, and the overall adjustment (for example, the electric adjustment and the confirmation of the operation) is performed. It is desirable that the projection exposure apparatus is produced in a clean room in which, for example, the temperature and the cleanness are managed.

When the microdevice (electronic device), for example, the semiconductor device is produced by using the projection exposure apparatus of the embodiment described above, the semiconductor device is produced by performing, for example, a step of designing the function and the performance of the device, a step of manufacturing a reticle based on the designing step, a step of forming a wafer with a silicon material, a step of performing the alignment and exposing the wafer with a pattern of the reticle by using the exposure apparatus of the embodiment described above, a step of forming a circuit pattern, for example, by the etching, a step of assembling the device (including a dicing step, a bonding step, and a packaging step), and an inspection step.

It is preferable that the photolithography step, which includes the device-producing step, especially the step (exposure step) of transferring the pattern onto the sensitive object by using the projection exposure apparatus of the embodiment described above, includes step of removing the pollutant of the embodiment described above, and the step of exchanging the optical member from which the pollutant is to be removed or at least a part of the optical system including the optical member, and the exchange step is preferably performed after executing the removal step a plurality of times. It is preferable that the step of measuring the image formation characteristic (for example, the wavefront aberration) of the projection optical system (and adjusting the image formation characteristic) is included not only after the exchange step but also after the removal step.

The present invention is equivalently applicable not only when the exposure apparatus of the scanning exposure type is used but also when the pollutant is to be removed from the optical member of the exposure apparatus of the full field exposure type. The present invention is also applicable when the pollutant is removed from the optical member of the liquid immersion type exposure apparatus disclosed, for example, in International Publication (WO) No. 99/49504. In the case of the liquid immersion type exposure apparatus, the surface of the optical member provided at the end of the projection optical system on the side of the image plane is immersed in the liquid (for example, pure water). Therefore, it is preferable that the outermost surface (thin film) of the optical member is formed of a material which is hardly affected by the liquid rather than the etching solution described above. When the pollutant, which is caused by the liquid, is difficult to be removed with the etching solution (BOE, BOE/IPA) described above, it is preferable that a solvent, which is appropriate to remove the pollutant, is mixed with or used in combination with the etching solution described above to perform the removing operation as described above. The present invention is also applicable when the pollutant is removed from the optical member of the exposure apparatus in which the wafer stage system as described above includes two wafer stages in order to perform the exposure operation and the alignment operation (mark-detecting operation) approximately concurrently as disclosed, for example, in International Publication (WO) No. 98/24115 and U.S. Pat. No. 6,341,007 corresponding thereto as well as International Publication (WO) No. 98/40791 and U.S. Pat. No. 6,262,796 corresponding thereto.

The way of use of the exposure apparatus of the present invention is not limited to the exposure apparatus for producing semiconductor devices. The present invention is also widely applicable, for example, to exposure apparatuses for the liquid crystal display element formed on the rectangular glass plate or for the display device such as the plasma display as well as exposure apparatuses for producing various devices including, for example, the image pickup element (for example, CCD), the micromachine, the thin film magnetic head, and the DNA chip. Further, the present invention is also applicable to the exposure step (exposure apparatus) when the mask (for example, the photomask and the reticle) formed with each of mask patterns of various devices is produced by employing the photolithography step.

It is a matter of course that the present invention is not limited to the embodiments described above, which may be embodied in other various forms without deviating from the gist or essential characteristics of the present invention. All of the contents of the disclosures of Japanese Patent Application No. 2002-350944 filed on Dec. 3, 2002 and Japanese Patent Application No. 2003-115098 filed on Apr. 18, 2003 including the specifications, claims, drawings, and abstracts are incorporated herein by reference exactly as they are.

According to the pollutant removal method of the present invention, it is easy to eliminate the pollutant adhered on the optical member. It is unnecessary to exchange the optical member unlike the conventional technique. Therefore, it is possible to reduce the price in relation to the exchange, the assembling and adjustment cost, and the maintenance cost.

In the present invention, the liquid, which contains hydrofluoric acid, is used as the washing solution. Accordingly, it is possible to quickly dissolve and remove the pollutant containing silicon oxide having been hitherto incapable of being removed.

According to the present invention, the transmittance of the optical member can be maintained to be high with ease.

Therefore, it is possible to maintain the throughput of the exposure step to be high. It is possible to efficiently produce various devices.

What is claimed is:

1. A pollutant removal method for removing a pollutant in an exposure apparatus which exposes an object with an illumination light beam from a light source via an optical system to transfer an image of a pattern onto the object, the exposure apparatus having an exposure portion which transfers the image of the pattern onto the object, a chamber, the optical system and the exposure portion being disposed inside the chamber, and a channel portion which is connected to the light source and leads the illumination light beam from the light source to the chamber, the exposure portion including a projection system which is a part of the optical system, the pollutant being adhered to an optical member of the projection system, the method comprising:
   preparing a wipe soaked with a cleaning solution containing hydrofluoric acid;
   containing the wipe in a container;
   bringing the container which contains the wipe into the chamber;
   removing the pollutant adhered to the optical member of the projection system by using the cleaning solution by wiping the member with the wipe, and
   removing the cleaning solution from the optical member by applying water to the optical member and separately applying a washing organic solvent to the optical member;
   wherein the removal of the pollutant and the removal of the cleaning solution are performed in the chamber and in a state in which the projection system is provided on the exposure apparatus.

2. The pollutant removal method according to claim 1, wherein pH of the cleaning solution is adjusted from 4 to 6 by adding ammonium fluoride to the hydrofluoric acid.

3. The pollutant removal method according to claim 1, wherein the cleaning solution is obtained by adding at least one of ammonium fluoride, water, and an organic solvent to the hydrofluoric acid.

4. The pollutant removal method according to claim 3, wherein the organic solvent is one of substances of isopropyl alcohol, methanol, ethanol, propanol, butanol, and acetone, or a mixture thereof.

5. The pollutant removal method according to claim 1, wherein the optical member is wiped with an elastic member soaked with the cleaning solution so as to remove the pollutant.

6. The pollutant removal method according to claim 1, wherein the cleaning solution contains ammonium fluoride and at least one of the water and the organic solvent.

7. The pollutant removal method according to claim 1, wherein the projection system includes a first plane on which the pattern is arranged and a second plane on which the object is arranged; and
   the optical member of the projection system includes an optical member of the projection system that is arranged most optically close to the first plane or the second plane.

8. The pollutant removal method according to claim 7, wherein the optical system includes an illumination system which illuminates the pattern with the illumination light beam; and
   the optical member includes an optical member of the illumination system that is arranged most optically close to the pattern.

9. The pollutant removal method according to claim 7, wherein pH of the cleaning solution is within a range of 4 to 6.

10. The pollutant removal method according to claim 7, wherein the cleaning solution contains the hydrofluoric acid and ammonium fluoride.

11. The pollutant removal method according to claim 1, wherein measurement of optical characteristics of the optical member is performed at least one of before the removal of the pollutant and after the removal of the pollutant.

12. The pollutant removal method according to claim 11, wherein information about the pollutant remaining on the optical member is obtained after the removal of the pollutant.

13. The pollutant removal method according to claim 11, wherein before the removal of the pollutant, judgment is made whether or not removal of the pollutant is required, based on a result of the measurement.

14. The pollutant removal method according to claim 11, wherein the optical member is disposed in the projection system at a light-incident end or a light-exiting end of the optical system.

15. The pollutant removal method according to claim 11, wherein pH of the cleaning solution is within a range of 4 to 6.

16. The pollutant removal method according to claim 11, wherein the cleaning solution contains the hydrofluoric acid and ammonium fluoride.

17. The pollutant removal method according to claim 16, wherein the cleaning solution contains at least one of the water and the organic solvent.

18. The pollutant removal method according to claim 1, wherein the optical member has a multi-layered film and a substrate, the multi-layered film being composed of an inorganic material including at least one of a fluoride and an oxide and being formed on the substrate of the optical member.

19. The pollutant removal method according to claim 18, wherein the fluoride is at least one of magnesium fluoride, calcium fluoride, aluminum fluoride, cryolite, thiolyte, neodymium fluoride, lanthanum fluoride, gadolinium fluoride, and yttrium fluoride.

20. The pollutant removal method according to claim 18, wherein the oxide is at least one of aluminum oxide, hafnium oxide, titanium oxide, and zirconium oxide.

21. The pollutant removal method according to claim 1, wherein a material of the substrate of the optical member is composed of quartz, fluorite, or optical glass.

22. The pollutant removal method according to claim 1, wherein the removal of the cleaning solution is performed by applying the water to the optical member and then applying the washing organic solvent to the optical member.

23. The pollutant removal method according to claim 1, wherein the removal of the pollutant and the removal of the cleaning solution are performed periodically a plurality of times, and then the optical member is detached from the projection system.

24. The pollutant removal method according to claim 23, wherein the optical member is cleaned after the optical member is detached from the optical system, and then the cleaned optical member is reattached to the projection system.

25. The pollutant removal method according to claim 23, wherein the optical member is exchanged after the optical member is detached from the projection system.

26. The pollutant removal method according to claim 1, wherein the exposure apparatus includes a mask stage and/or a substrate stage and the chamber accommodates the mask stage and/or the substrate stage.

27. The pollutant removal method according to claim 1, wherein the channel portion is formed in an opening of the chamber.

28. The pollutant removal method according to claim 1, wherein the exposure apparatus includes a subchamber, the subchamber accommodating an illumination optical system and being disposed inside the chamber, one end portion of the subchamber being the channel portion, the other end portion of the subchamber being detachably formed.

29. The pollutant removal method according to claim 1, wherein the chamber includes a door at one side thereof, and the removal of the pollutant and the removal of the cleaning solutions are performed in a state in which an air surrounding the chamber is controlled to move from a side opposite to the one side toward the one side.

30. The pollutant removal method according to claim 1, wherein the removal of the pollutant and the removal of the cleaning solutions are performed in a state in which an air inside-the chamber is guided to a specific direction of an outside of the chamber by a blower provided in a clean room.

31. The pollutant removal method according to claim 1, wherein the exposure apparatus further includes a subchamber through which the illumination light beam from the light source passes, the subchamber being connected to the channel portion and being accommodated in the chamber.

\* \* \* \* \*